US007606375B2

(12) United States Patent
Bailey et al.

(10) Patent No.: US 7,606,375 B2
(45) Date of Patent: Oct. 20, 2009

(54) METHOD AND SYSTEM FOR AUTOMATICALLY GENERATING WORLD ENVIRONMENTAL REVERBERATION FROM GAME GEOMETRY

(75) Inventors: Richard S. Bailey, Kirkland, WA (US); Barry Brumitt, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 1060 days.

(21) Appl. No.: 10/963,042

(22) Filed: Oct. 12, 2004

(65) Prior Publication Data

US 2006/0075885 A1 Apr. 13, 2006

(51) Int. Cl.
*H03G 3/00* (2006.01)
*G06F 17/00* (2006.01)
*G09G 5/00* (2006.01)
*G06T 15/70* (2006.01)
*G06G 7/48* (2006.01)

(52) U.S. Cl. ............................ 381/63; 381/61; 381/62; 345/418; 345/582; 345/473; 463/30; 463/31; 463/32; 463/33; 463/35; 463/34; 700/94; 703/6

(58) Field of Classification Search ............. 381/61–63; 700/94; 84/630; 703/6; 181/284–296; 345/418–428, 345/582–619, 473–475; 463/30–35

See application file for complete search history.

(56) References Cited

U.S. PATENT DOCUMENTS 6,091,824 A * 7/2000 Lin et al. ...................... 381/63
2005/0182608 A1* 8/2005 Jahnke .......................... 703/6

OTHER PUBLICATIONS

3D Working Group of the Interactive Audio Special Interest Group, Interactive 3D Audio Rendering Guidelines, Sep. 20, 1999, revision 1.0a, 29 pages, published by MIDI Manufacturers Association, Los-Angeles, CA, Copyright 1999 MIDI Manufacturers Association Incorporated, Portions of the Common Property Sets are Copyright 1997 Creative Labs.*

3D Working Group of the Interactive Audio Special Interest Group, Interactive 3D Audio Rendering Guidelines, Sep. 20, 1999, revision 1.0a, 29 pages, published by MIDI Manufacturers Association, Los Angeles, CA, Copyright 1999 MIDI Manufacturers Association Incorporated, Portions of the Common Property Sets are Copyright 1997 Creative Labs, used with permission, Printed 1999.

Microsoft Corporation, Microsoft DirectX 9.0 Environmental Reverberation, removed from the Internet Jul. 27, 2004, 2 pages, http://msdn.microsoft.com/library/en-us/directx9_c/directx/htm/environmentalreverberation.asp?frame=true.

* cited by examiner

*Primary Examiner*—Devona E. Faulk
(74) *Attorney, Agent, or Firm*—Workman Nydegger

(57) ABSTRACT

Reverberation parameters for one or more positions of interest are derived from graphics data used for displaying a computer-generated environment. For each position of interest for which reverberation parameters are desired, environmental parameters including distances and the hardness of features in a range of interest and at points on cubemap faces are automatically determined from the graphics data. The environmental parameters are stored with the graphics data and associated with each position of interest. Upon rendering of the computer-generated environment, reverberation property set values usable by a reverberation engine are calculated or interpolated between predetermined values according to the environmental parameters. Thus, values such as reverb, reverb delay, reflections, decay time, reflection delay, and other reverb parameters are automatically calculated, subject to selective operator tuning, and provide realistic reverberation effects in the sounds heard by a user who is experiencing the rendered environment.

70 Claims, 13 Drawing Sheets

METHOD AND SYSTEM FOR AUTOMATICALLY GENERATING WORLD ENVIRONMENTAL REVERBERATION FROM GAME GEOMETRY

FIELD OF THE INVENTION

The present invention generally pertains to computer-generated audio, and more specifically, to a method and system for adjusting reverberation of computer-generated sounds.

BACKGROUND OF THE INVENTION

The tremendous advancements made in computer technology and price/performance over the past few decades has revolutionized computer graphics. For example, early personal computers featured games that provided only monochromatic images, or chalky, low-resolution images including only a few colors at a time. By contrast, today's video games present realistic, three-dimensional images in thousands of colors. Sports games feature likenesses of players that are so accurate and detailed that the players' faces actually can be recognized in the computer animation. In fact, such clarity is possible not only on personal computers, but on video game systems retailing for less than $150. Similarly, movie studios continually expand their use of computer graphics in creating feature films, making the unreal believable. Computer graphics have been used to create increasingly better special effects, as well as entirely computer-generated feature films. Still more films feature live actors in movies where one or more of the other characters are entirely computer-generated, and/or some or all of the backdrops are computer-generated.

In support of improved computer graphics, computer audio hardware systems have improved a great deal. Instead of a single tinny-sounding internal speaker used to generate beeps and monophonic tones in early personal computers, current audio hardware is able to generate high fidelity music and multi-channel surround sound. For example, the Microsoft Corporation's XBOX™ gaming system includes a media communications processor (MCP) with a pair of digital signal processors capable of processing billions of instructions per second. In addition to providing network access and performing other functions, the MCP includes an audio system capable of driving a six-speaker, surround sound audio system. Furthermore, the audio system is capable of precisely controlling audio reverberation for generating three-dimensional audio in conformance with the Interactive Audio Special Interest Group (IASIG) of the MIDI Manufacturers Association Interactive 3D Audio Rendering Guidelines—Level 2.0 Specification (I3DL2). This specification is also recognized by personal computer-based audio systems, such as Microsoft Corporation's DirectSound™ audio specification, as well as by other audio systems.

Audio systems adhering to the I3DL2 specification (and other audio systems) can provide very realistic three-dimensional sound. For example, the I3DL2 specification recognizes twelve different input values that can be set to precisely tailor audio effects, including: ROOM, ROOM_HF, ROOM_ROLLOFF_FACTOR, DECAY_TIME, DECAY_HF_RATIO, REFLECTIONS, REFLECTIONS_DELAY, REVERB, REVERB_DELAY, DIFFUSION, DENSITY, and HF_REFERENCE.

The ROOM value generally adjusts the potential loudness of non-reverb sounds by setting an intensity level and low-pass filter for the room effect, with a value ranging between −10000 mB and 0 mB. The default value is −10000 mB. The ROOM_HF value determines the proportion of reverberation that includes high frequency sounds versus low frequency sounds. More specifically, ROOM_HF specifies the attenuation of reverberation at high frequencies relative to the intensity at low frequencies. ROOM_HF can be a value between −10000 mB and 0 mB. The default value is 0 mB. The ROOM_ROLLOFF_FACTOR value determines how quickly sound intensity attenuates over distance, in the environment. For example, ROOM_ROLLOFF_FACTOR might be used to model an environment consisting of warm, moist air, which squelches sound more quickly than cool, dry air. ROOM_ROLLOFF_FACTOR is a ratio that can include a value between 0.0 and 10.0, and the default value is 0.0.

In addition to these values that control propagation effects of sound, other values more specifically relate to the reverberation of sound. The DECAY_TIME value specifies the decay time of low frequency sounds until the sound becomes inaudible and can be set between 0.1 and 20.0 seconds, with a default value of 1.0 seconds. The DECAY_HF_RATIO value determines how much faster high frequency sounds decay than do low frequency sounds. DECAY_HF_RATIO can be set between 0.1 and 2.0, with a default value of 0.5.

The REFLECTIONS value determines the intensity of initial reflections relative to the ROOM value and can be set between −10000 mB and 1000 mB, with a default value equal to −10000 mB. The REFLECTIONS_DELAY value specifies the delay time of the first sound reflection, relative to the directly received sound and can be set between 0.0 and 0.3 seconds, with a default value of 0.02 seconds. The REVERB value determines the intensity of later reverberations, relative to the ROOM value or, generally, how "wet" the reverberation level is in terms of the overall sound. REVERB can be set to a value between −10000 mB and 2000 mB, and the default value is −10000 mB. The REVERB_DELAY value specifies the time limit between the early reflections and the late reverberation, relative to the time of the first reflection. REVERB_DELAY can be set between 0.0 and 0.1 seconds, with a default value of 0.04 seconds. The DIFFUSION value controls the amplitude intensity of reverberation in the late reverberation decay and can be set between 0.0% and 100.0%, with a default value of 100.0%. The DENSITY value represents the percentage of the modal density in the late reverberation decay, which can be thought of as the portion of surfaces reverberating distinct sounds. Density can be a value between 0.0% and 100.0%, with a default value of 100.0%. Finally, the HF_REFERENCE value sets the delineation point between which sounds are considered high frequency as opposed to low frequency, for purposes of any frequency-based distinction, such as applied in the DECAY_HF_RATIO. HF_REFERENCE can be set anywhere in the audible range between 20.0 Hz and 20,000.0 Hz. The default value is 5000.0 Hz.

Clearly, sound engines recognizing the I3DL2 specification and similar specifications provide software designers and creators tremendous control in tailoring the reverberation of sound to provide a realistic three-dimensional auditory experience. Unfortunately, however, with all of the capabilities provided by the I3DL2 specification and other such specifications, the capability of the audio system and other computer components affecting sound tends to be underutilized. Although systems recognizing the I3DL2 specification provide great control, I3DL2 also imposes a tremendous amount of work for software engineers to determine and set the myriad of values needed to appropriately generate realistic sound effects within a computer-generated environment.

For example, consider a street racing game in which a user controls an automobile as it races around in a city. The track or course followed by the auto will pass through open areas, past buildings, under bridges, and encounter various types of objects. As any driver of an actual automobile will readily understand, objects in the nearby environment affect how the sound generated by the automobile reverberates and how the quality of the sound heard inside the automobile changes as the automobile passes near and past the objects. Thus, to create "believable" reverb effect for sound in such a game, as the automobile is driven around the track, the different parameters provided in the I3DL2 specification all need to be appropriately set—either at spaced apart intervals, or for each object or set of objects encountered by the auto in the virtual environment. This process can literally involve person years to accomplish for a single game. Therefore, unfortunately, when deadlines approach or budgets dwindle as the coding of a game reaches the deadline for completion, the resources devoted to setting these parameters may be reduced or cut. As a result, the quality and realism of the reverb sounds experienced by users of the game may be unsatisfactory, or at least unremarkable.

Not only is setting these reverb parameters incredibly labor intensive, but it also is prone to human bias and error, so that the results can be unpredictable and unrealistic. As a further example, a game might involve a character that moves through different rooms of a building. Creation of the reverb parameters for a single environment might be divided between multiple audio designers. Unfortunately, each of the designers may have different predispositions and preferences regarding the audio quality. As a result, as the character passes from a room configured by a first audio designer to a room configured by a second audio designer, even if the rooms are very similar, the reverberations may be noticeably different. Certainly, in a well-designed game, movement between areas should be as seamless as possible, and significant shifts in audio effects should only occur when moving between significantly different types of spaces. Unwarranted shifts in audio quality thus detract from the realism and the user's appreciation and enjoyment of the game.

Thus, although the capabilities exist in computer systems and gaming systems to provide for realistic three-dimensional audio, the reality of achieving these capabilities may exceed the resources of programmers and designers creating a game or other form of virtual environment. As a result, the dimensional qualities of the audio generated may be somewhat unrealistic.

It would thus be highly desirable to improve the method used for creating computer-generated audio to enable a realistic sound quality to be achieved. Specifically, it would be desirable to simplify the process of setting audio parameters to provide for reverb effects that appropriately match the virtual environment portrayed in the video portion of the computer generation. This approach should greatly reduce the resources, time, and cost involved by eliminating the need for manually setting these parameters. Further, it would be desirable to automatically set the parameters so as to ensure smooth consistent transitions in the sound produced by the computer when moving between different portions of the computer-generated virtual environment.

SUMMARY OF THE INVENTION

One of the advantages of the present invention is that it provides a fast, non-labor-intensive method for setting reverb parameters for a computer-generated environment. As described above, to simulate the physical world, computer systems such as personal computers include reverb engines, but these reverb engines can require that as many as a dozen or more parameters be set to fully and realistically control the reverberation of sounds relative to the environment in which the sounds appear to be heard. In the physical world, the reverberation of sounds is determined by a combination of factors, including the composition of objects that reflect the sounds and the location of those objects relative to the source of the sounds and the listener. Comparably, for a computer-generated environment, embodiments of the present invention determine how objects present in the computer-generated environment would cause sound to reverberate as if in the real world and generate resulting reverberation parameters that can be applied to produce corresponding realistic sounding reverberation effects when the game is executed by a user. The reverberation parameters are created and stored for different points throughout a computer-generated environment. Thus, when the computer-generated environment is rendered, the reverberation parameters are retrieved and applied when generating sounds in the environment.

In addition to simplifying the process of setting reverberation parameters, embodiments of the present invention also ensure that reverberation parameters are set more consistently than might occur if the parameters were subjectively manually set, particularly if set by different persons. Setting reverberation parameters manually can yield inconsistent results. The settings of the reverberation parameters manually applied by a human designer in different parts of the environment may result in unnatural-sounding reverb when the listener's (i.e., the user's) point of hearing passes from one part of the virtual environment to another. The juxtaposition of the sets of parameters resulting from a user passing from one area to the other may expose unnatural changes in the degree of reverberation, reverb delay, decay time, proportion of high frequency reverberations, and other attributes. Moreover, multiple human audio designers working with different portions of a computer-generated environment may have significantly different tendencies and preferences that may be revealed only when the computer-generated environment is rendered, when those differences result in clearly audible discontinuities. By contrast, embodiments of the present invention automatically generate reverberation parameters based on features existing in the computer-generated environment, and thus, the parameters are consistently based on structures in the virtual environment and not subjective preferences of human designers that can vary dramatically between designers.

One aspect of the present invention is thus directed to a method for automatically deriving reverberation characteristics for a computer-generated environment from graphics data describing visually displayable contents of the computer-generated environment. A position of interest is selected in the computer-generated environment. The graphics data describing a portion of the computer-generated environment viewable from the position of interest when the computer-generated environment is rendered are accessed. Reverberation characteristics are derived for the position of interest from the graphics data describing each of a plurality of points in the portion of the computer-generated environment. The reverberation characteristics are derived at least in part from a distance of each point from the position of interest and a hardness value associated with the point.

The reverberation characteristics include at least one of property set values usable by a reverberation engine, and a plurality of environmental parameters from which the property set values are calculable when the computer-generated environment is rendered. The property set values are configured to be supplied to a reverberation engine conforming to at least one of the IA3DL2 specification and the EAX specification. The environmental parameters for the points include at least one of a mean distance to the points, a mode distance to the points, a median distance to the points, a mean hardness associated with the points, and a total number of points in the portion of the computer-generated environment. A subset of the points may be selected that describe the portion of the computer-generated environment viewable from the position of interest, the subset including points within at least one of a distance range from the position of interest and a lateral range relative to the position of interest. A plurality of subsets of points describing the portion of the computer-generated environment may be identified, with each of the plurality of subsets of points including points at a plurality of mode distances from the position of interest and having a plurality of mode hardnesses of points at a particular distance. Separate delay lines relating to each of the plurality of subsets of points may be used in developing the reverberation characteristics for the position of interest. The environmental parameters also may include a total number of points within the subset.

A portion of the property set values are derived in proportion to the total number of points within the subset relative to the total number of points. The property set values so derived preferably include at least one of a reverb decay time and a reverb volume. A portion of the property set values are proportional to the mean hardness of the points, including at least one of a decay high frequency ratio, a room high frequency attenuation, and a reflections delay time. In addition, a portion of the property set values are proportional to the distances to the points from the position of interest, the portion of the property set values including at least one of a decay time, a reflections intensity, a reflections delay time, and a reverb intensity.

The graphics data may include a cubemap describing the visually displayable contents of the computer-generated environment viewable from the position of interest. The reverberation characteristics for the position of interest are thus based on points representable on a plurality of faces of the cubemap. The reverberation characteristics derived from each of the plurality of faces is weighted according to at least one of a face with which the point is associated, and a position within the face with which the point is associated.

The hardness value is derivable from a feature with which the point is associated and may be retrieved from a hardness value table listing hardness values associated with compositions of features potentially included in the computer-generated environment.

A plurality of reverberation characteristics for the position of interest from the graphics data may be derived to correspond to a plurality of aspects of the position of interest. Each of the plurality of reverberation characteristics then are applied to audio channels corresponding to the aspects of the position of interest upon execution of the computer-generated environment. The aspects of the position of interest may correspond to at least one of lateral sides of the position of interest and forward and rearward faces of the position of interest. The plurality of reverberation characteristics for the position of interest may be determined by identifying a plurality of secondary positions of interest corresponding to the aspects of the position of interest, and determining the reverberation characteristics for each of the secondary positions of interest.

The reverberation characteristics may be derived in a preprocessing step performed before the computer-generated environment is visually rendered. The distance from the position of interest to each of the plurality of points is stored in a depth buffer, and the hardness of each of the plurality of points is stored in a stencil buffer. The reverberation characteristics are stored in association with the position of interest such that the reverberation characteristics are retrievable when the computer-generated environment is visually rendered.

A series of reverberation characteristics for a plurality of positions of interest within the computer-generated environment may be calculated, where the plurality of positions include at least one of a plurality of positions selected by an operator, and a plurality of positions at predetermined intervals along an exemplary path through the computer-generated environment. Reverberation characteristics for an additional position for which the reverberation characteristics were not previously calculated are derivable by interpolating the reverberation characteristics for at least two other positions of interest proximate to the additional position.

An operator can be enabled to adjust at least one of an allowable range of reverberation characteristics and operands used in deriving the property set values from the reverberation characteristics. Reverberation characteristics may be adjusted for the position of interest by using reverberation characteristics for an alternate position of interest that is either ahead or behind the position of interest in the computer-generated environment.

Another aspect of the present invention is directed to a memory medium having machine executable instructions stored for carrying out steps and a system configured to execute steps that are generally consistent with the steps of the method described above.

BRIEF DESCRIPTION OF THE DRAWING FIGURES

The foregoing aspects and many of the attendant advantages of this invention will become more readily appreciated as the same becomes better understood by reference to the following detailed description, when taken in conjunction with the accompanying drawings, wherein.

Figure 10:
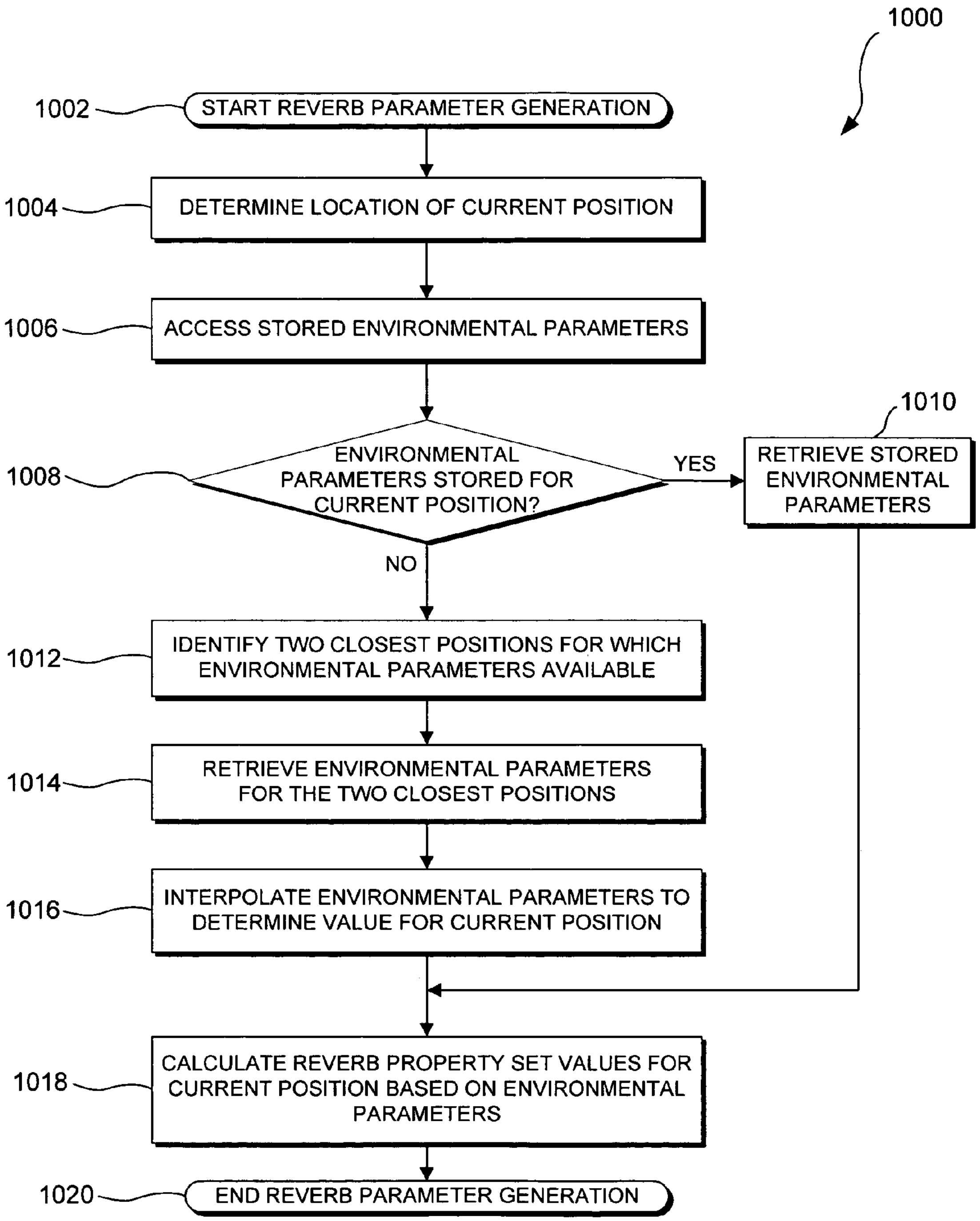
Figure 11:
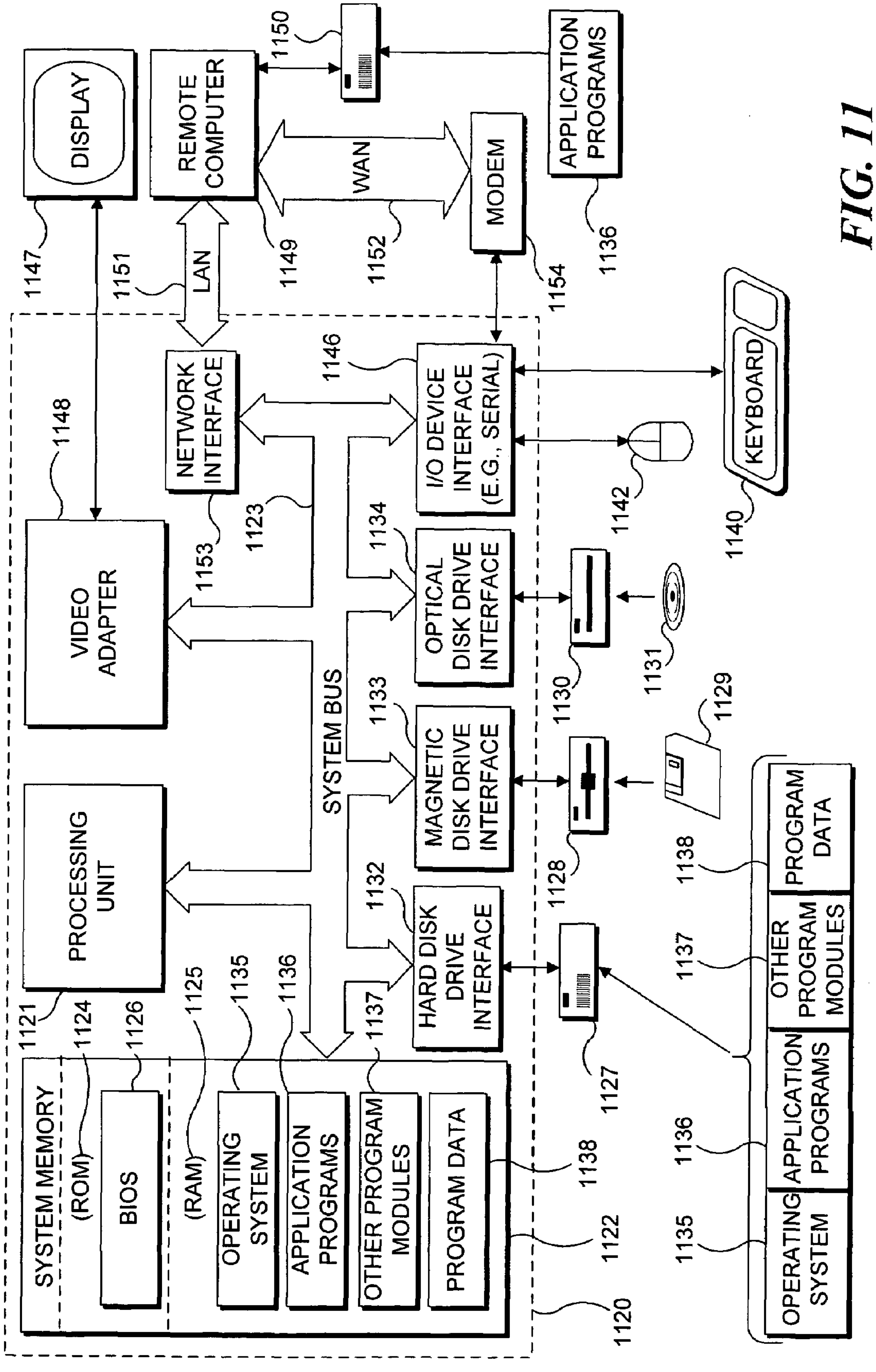

FIG. 10 is a flow diagram illustrating logical steps for deriving reverberation property value sets from environmental parameters stored with data describing a computer-generated environment; and FIG. 11 is a functional block diagram of a generally conventional computing device or personal computer (PC) that is suitable for generating reverberation parameters in practicing the present invention and for applying the reverberation parameters to produce sound when rending the computer generated environment for which the reverberation parameters were generated.

DESCRIPTION OF THE PREFERRED EMBODIMENT

Figure 1:
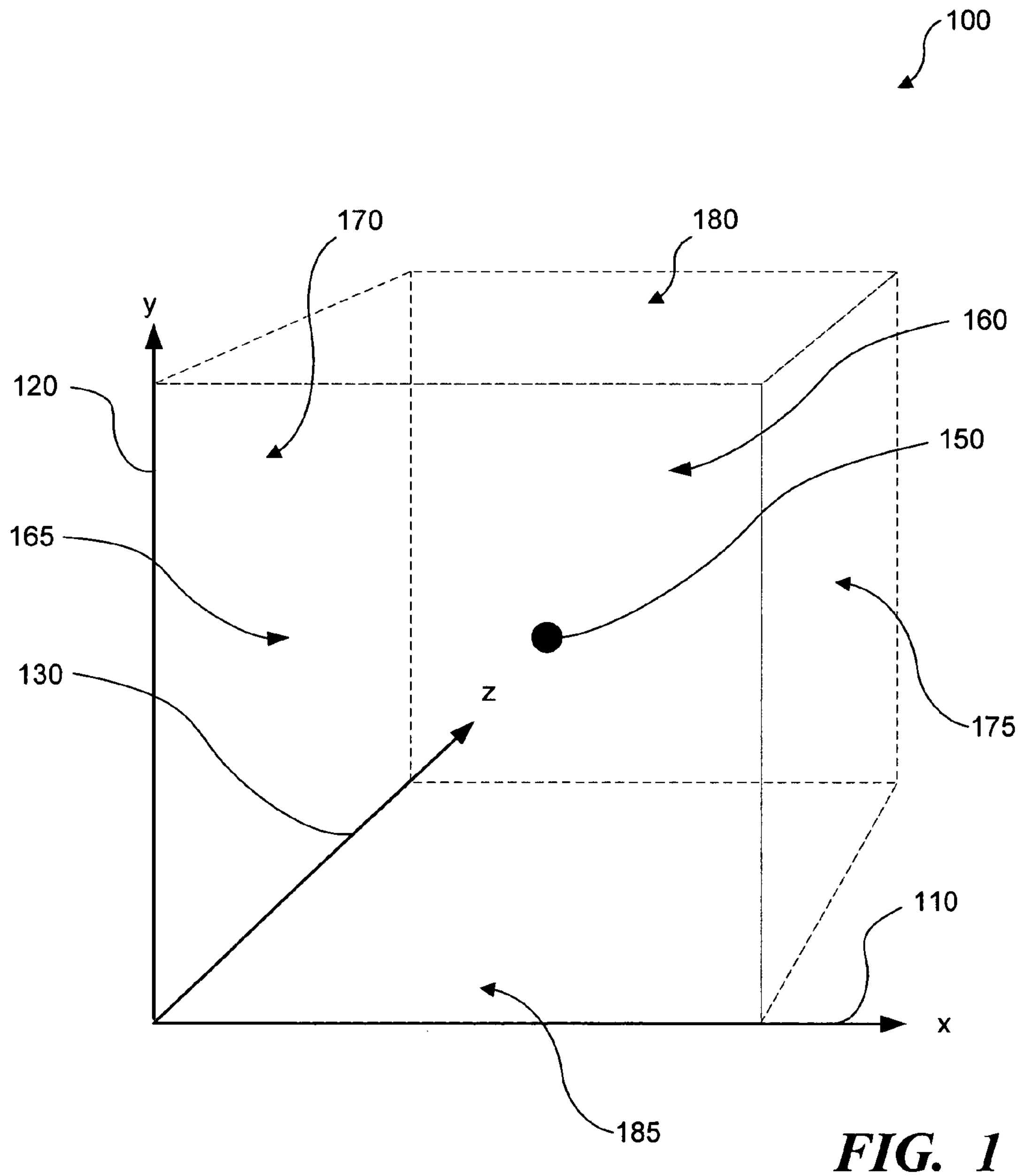
FIG. 1 is a perspective diagram of a bare cubemap in a coordinate space for a position of interest.

Identifying Visually Representable Features in Generating Reverberation Parameters FIG. 1 is a perspective diagram of a bare cubemap 100 in a coordinate space defined by axes 110, 120, and 130 for a position of interest 150, that is within the cubemap. Axes 110 and 120 are conventional x- and y-axes, respectively, defining a conventional two-dimensional plane. Orthogonal to x-axis 110 and y-axis 120 is a z-axis 130. For purposes of this description, z-axis 130 generally indicates a direction of motion through a computer-generated environment, i.e., a virtual environment. Although movement is possible along x-axis 110 and y-axis 120, the predominant direction of motion will be considered to be along z-axis 130 that, for example, lies along a track in a racing simulation that is described in greater detail below.

Position of interest 150 is at the center of cubemap 100. Cubemap 100 includes six faces, one for each face of the described cube. With z-axis 130 indicating the direction of motion, a face 160 is a forward face of cubemap 100 and a face 165 is a rear face of the cubemap 100. Thus, while traveling forward in the computer-generated environment, a user sees forward face 160 while rear face 165 lies behind the user. Similarly, a left face 170 and a right face 175 indicate what appears to the sides of the user as the user proceeds through the computer-generated environment, while an upper face 180 and a lower face 185 indicate what lies above and below the user, respectively. To those familiar with computer-generated environments, cubemap 100 represents a complete environment around position of interest 150 such that, as the user turns a field of view horizontally or vertically, faces 160-185 fully represent a simulated three-dimensional space about the position of interest.

Figure 2:
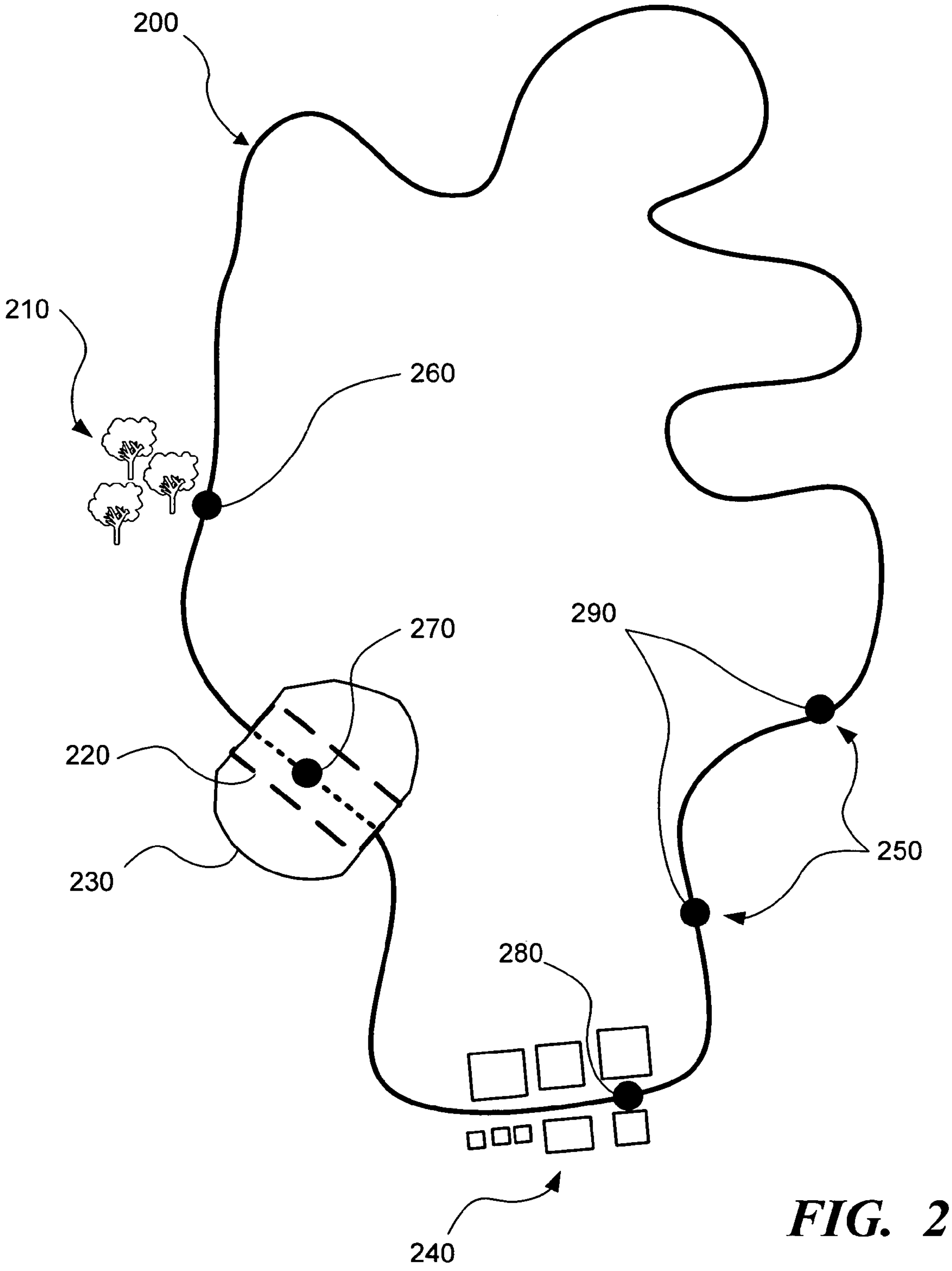
FIG. 2 is a spline joining a plurality of positions of interest in an exemplary computer-generated environment.

FIG. 2 is a spline 200 joining a plurality of positions of interest in an exemplary computer-generated environment. In the example illustrated in FIG. 2, the computer-generated environment presents an automobile track in a racing simulation. It will be appreciated that the environment could also represent a maze, a series of buildings, a region of free space, or any other simulated environment, and the spline would represent an expected path through that environment. Alternatively, the computer-generated environment is not restricted to one where an expected path might be followed, and the plurality of positions of interest may include a two-dimensional or three-dimensional array of positions of interest throughout a computer-generated environment.

As shown in FIG. 2, the track represented by spline 200 passes by a group of trees 210, passes through a tunnel 220 under a mountain 230, passes through a town or other grouping of buildings 240, as well as through a number of open spaces 250. As will be familiar to automobile drivers, the reverberation of sounds produced by the automobile that is heard by the driver is very different when the auto is on an open section of road, compared to when it is passing between buildings, passing through a tunnel, or passing by or through other structures. When an automobile passes a position of interest 280 between buildings 240, sound generated by the automobile will reverberate more than it does at positions of interest 290, which are located on a section of open road 250. On either side of position of interest 280, the reverberation may vary as a function of the proximity to the auto of buildings on either side of the automobile, as well as the width or height of the buildings, and the presence of space between buildings for cross-streets or other openings. Reverberation also may change as a result of the hardness of the materials from which the buildings and other nearby objects are constructed or comprise. It will be appreciated that the reverberation experienced while passing a building covered in wood shingles or siding will be markedly different from the reverberation experienced when passing a building covered in stone or brick, for example. Further alternatively, passing by a group of trees 210 that is alongside the road at position of interest 260 may result in no or little reverberation of sound from the trees. Passing through position of interest 270, through tunnel 220 under mountain 230, in contrast, may result in a very substantial reverberation due to the reflection of sounds from the rigid, nearby surfaces inside the tunnel.

Figure 3:
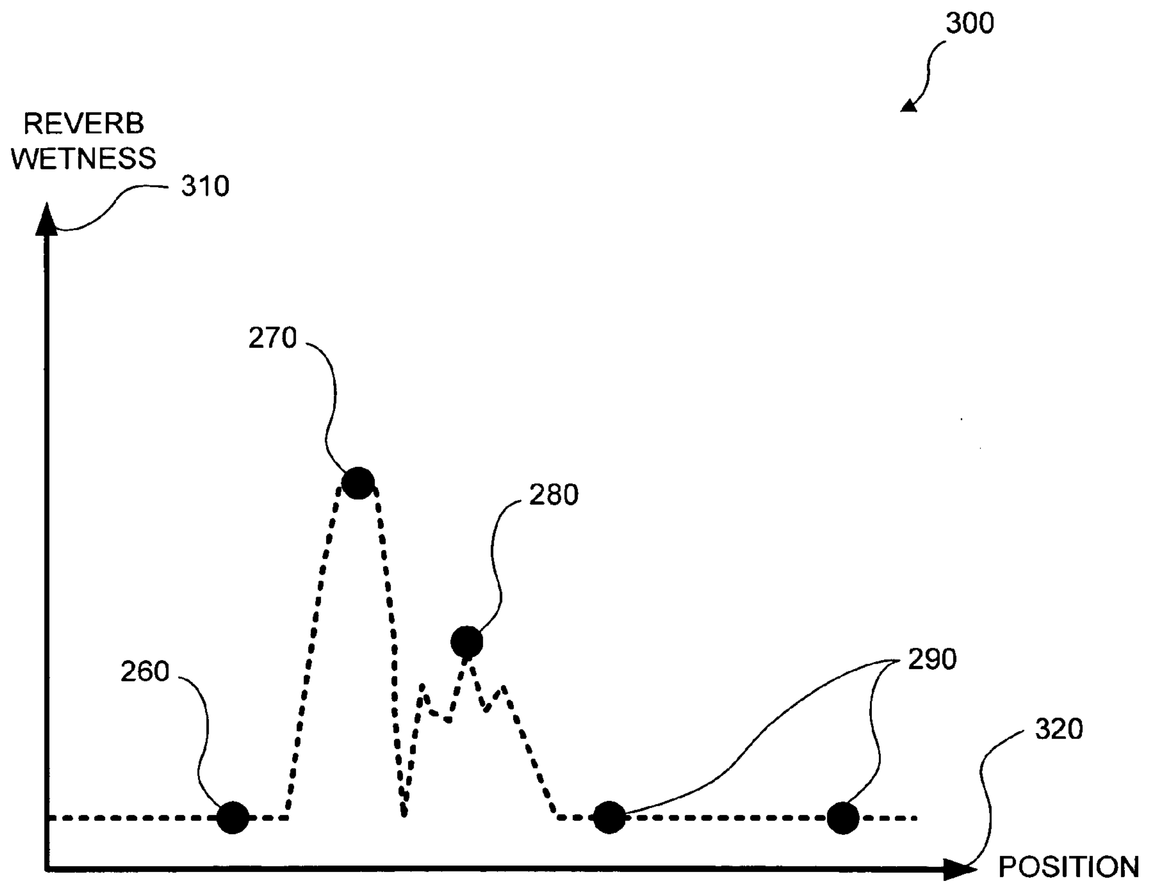
FIG. 3 is a line graph of a potentially desired wetness versus dryness of a reverb pattern for the plurality of positions of interest along the spline of FIG. 2.

In describing reverberation, positions where reverberation is high are referred to as "wet," while positions where reverberation is low are referred to as "dry." FIG. 3 is a line graph 300 of a reverb wetness 310 plotted versus a position 320, for the positions of interest along the spline of FIG. 2. At position of interest 260, the distance and/or relatively soft composition of trees 210 (FIG. 2) results in no appreciable increase in the reverb wetness. However, when passing through position of interest 270 in tunnel 220, the reverb wetness peaks as a result of the automobile passing through a space that is bounded by hard materials that do not absorb sound. It should be noted that the reverb wetness also increases upon approaching tunnel 220 and while moving away from the tunnel as a result of sound reverberating from the hard materials comprising the face of tunnel 220 and/or the surface of mountain 230. The reverb wetness decreases between position of interest 270, but increases again upon passing between buildings 240 surrounding position of interest 280. The reverb wetness also varies based on the size, spacing, composition, and position of buildings 240. Upon leaving position of interest 280 and reaching positions of interest 290 in open country 250, reverb wetness 310 declines to a fully dry level, i.e., to a level where the reverberation is virtually nil.

In computer-generated environments it is desirable to accurately recreate or simulate these reverb effects to add to the realism, drama, and/or ambiance of the computer-generated environment. As described above, with so many reverberation parameters to set, manual calibration of reverberation parameters responsive to features 210-250 would represent a highly labor-intensive task, open to undesirable variations based solely on individual designer predispositions or preferences. Embodiments of the present invention determine position and characteristics of features such as 210-250 and then automatically generate appropriate reverberation characteristics that are applied when the computer-generated environment is rendered.

Determining Reverberation Characteristics from Graphics Data

Figure 4A:
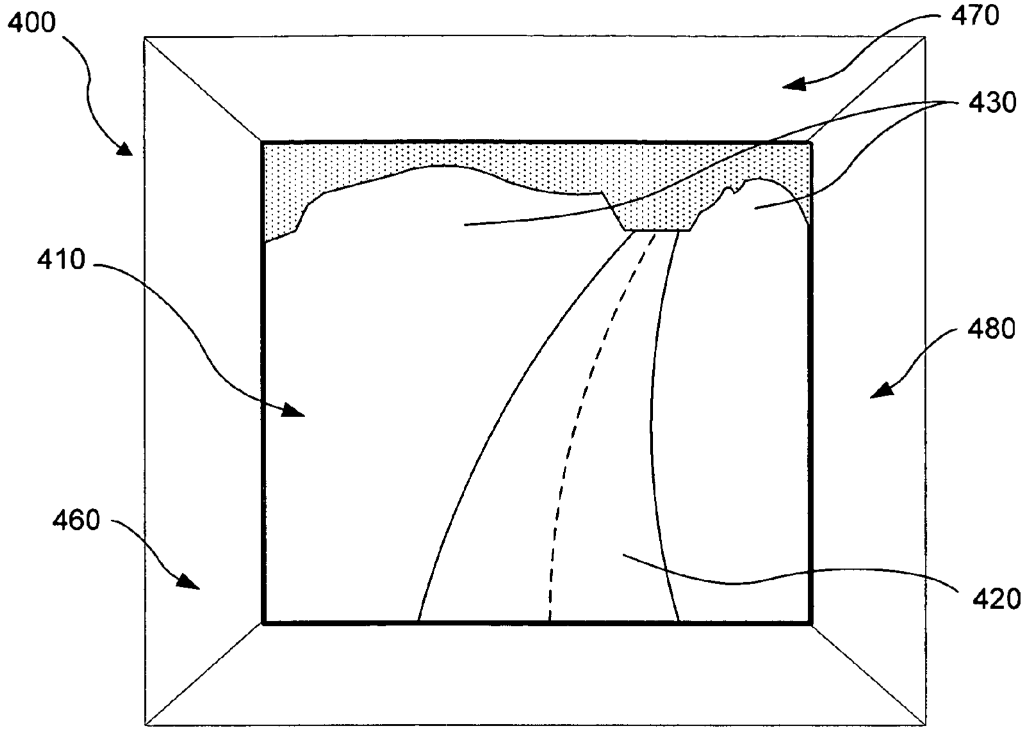
FIGS. 4A-4D represent faces of a cubemap encompassing a first position of interest along the spline of FIG. 2.
Figure 5A:
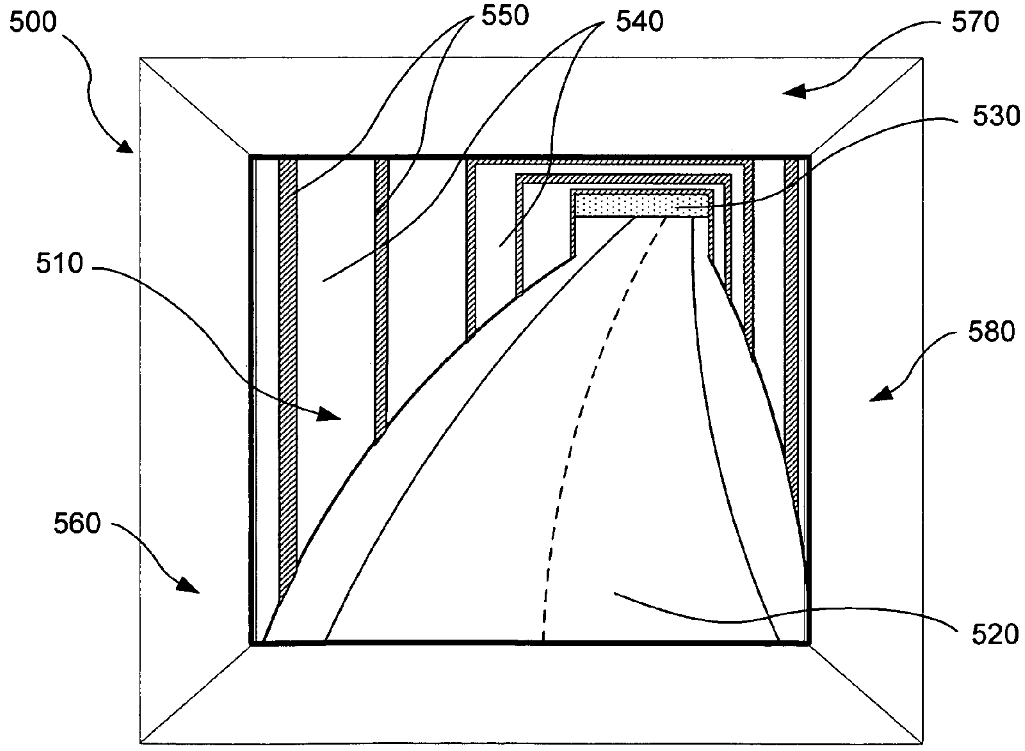
FIGS. 5A-5D represent faces of a cubemap encompassing a second position of interest along the spline of FIG. 2.

For purposes of illustration, FIG. 4A shows a rendering of a forward face 410 of a cubemap 400 associated with point 260 (FIG. 2). Forward face 410 shows open road ahead with no nearby prominent features that could cause sound to reverberate. Distant topographical features 430 are too far away to have much affect on local reverberation. By contrast, FIG. 5A shows a rendering of a forward face 510 of a cubemap 500 associated with point 270. Forward face 510 depicts not only road 520, but also an open end 530 of tunnel 230, as well as tunnel walls 540 and support beams 550. In the environment depicted in cubemap 500, tunnel walls 540 are rendered as made of concrete buttressed by wooden support beams 550. The presence of these features in an actual physical environment would change the reverberation from sounds generated by the automobile relative to the reverberation outside the tunnel. Accordingly, the present invention is able to detect these objects and properly select the reverberation parameters accordingly.

Figure 4B:
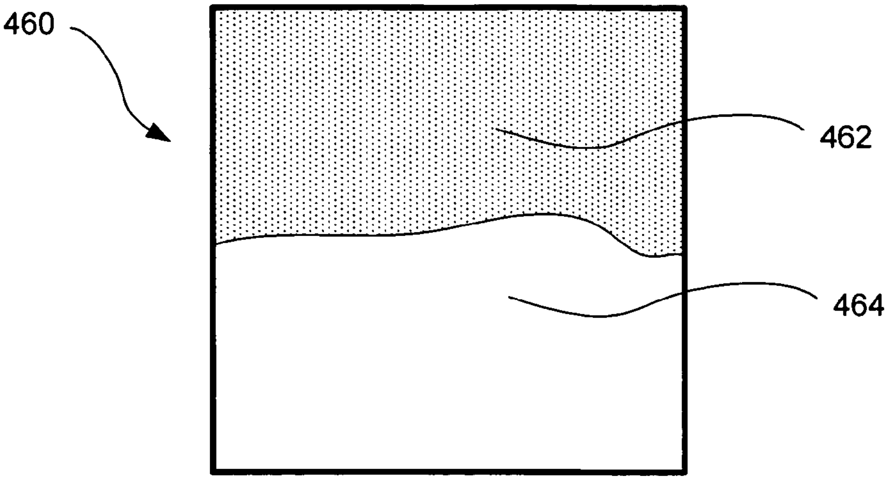
Figure 4C:
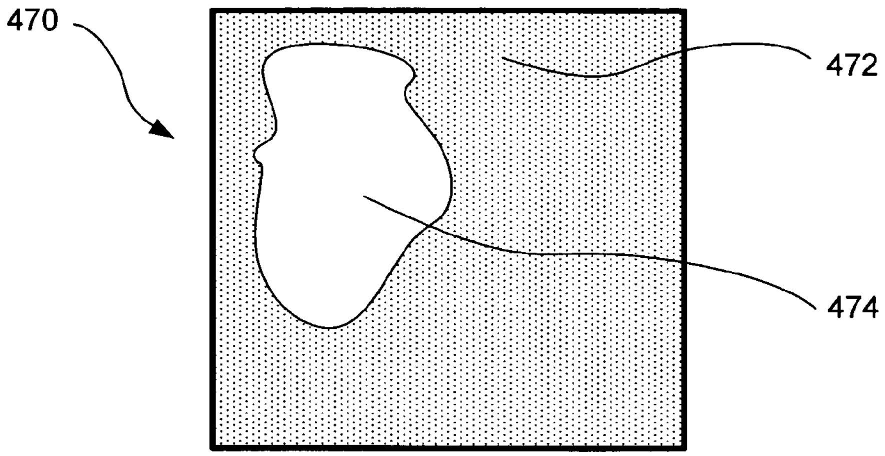
Figure 4D:
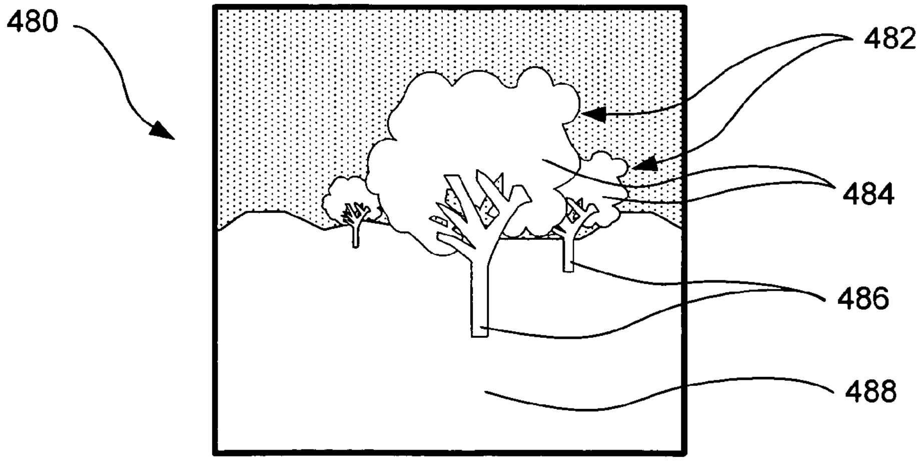

Furthermore, as is true in an actual physical environment, it is not only the features appearing ahead that may have an affect on reverberation of sound, but also, for example, features on left faces 460 and 560, overhead faces 470 and 570, and right faces 480 and 580. FIGS. 4B-4D respectively illustrate a left face 460 of cubemap 400, an overhead face 470 of cubemap 400, and a right face 480 of cubemap 400. The features represented in cubemap 400 can have little effect on the reverberation of sound. Left face 460 includes only open sky 462 and open terrain 464. Overhead face 470 includes only more open sky 472 and a distant cloud 474. Right face 480 does include a number of deciduous trees 482, each having leafy branches 484 atop a wooden trunk 486, growing in a grassy field 488. From the vantage point of a moving automobile, for example, faces 460, 470, and 480 include very few surfaces from which sound might reverberate. Nothing in open sky 462 and open terrain 464 to the left should reflect sound. Similarly, nothing in open sky 472 or cloud cover 474 overhead should reflect sound. Finally, while hard wooden trunks 486 of deciduous trees 482 may reflect some sound, trees 482 make up only a relatively small portion of the content of right face 480. Further, the leafy branches 484 atop trunks 486 might absorb most or all of the reflected sound. Also, trees 482 may not be close enough to the automobile to result in any appreciate reflected sound.

Figure 5B:
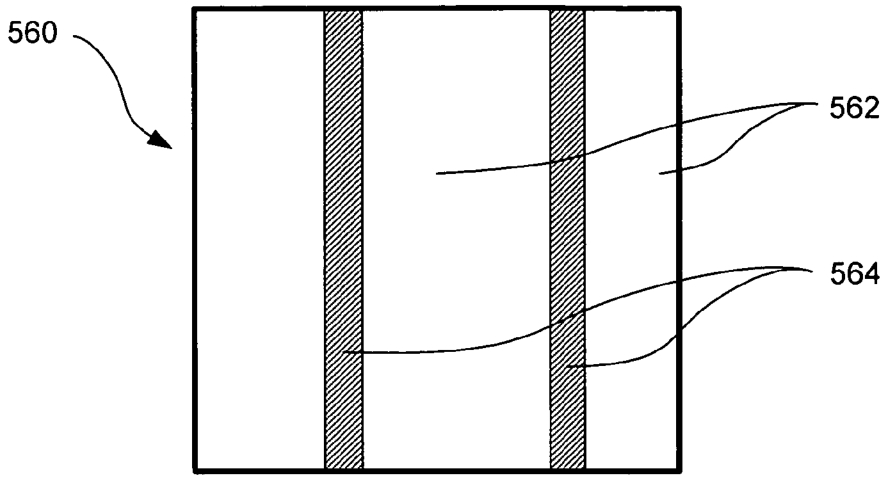
Figure 5C:
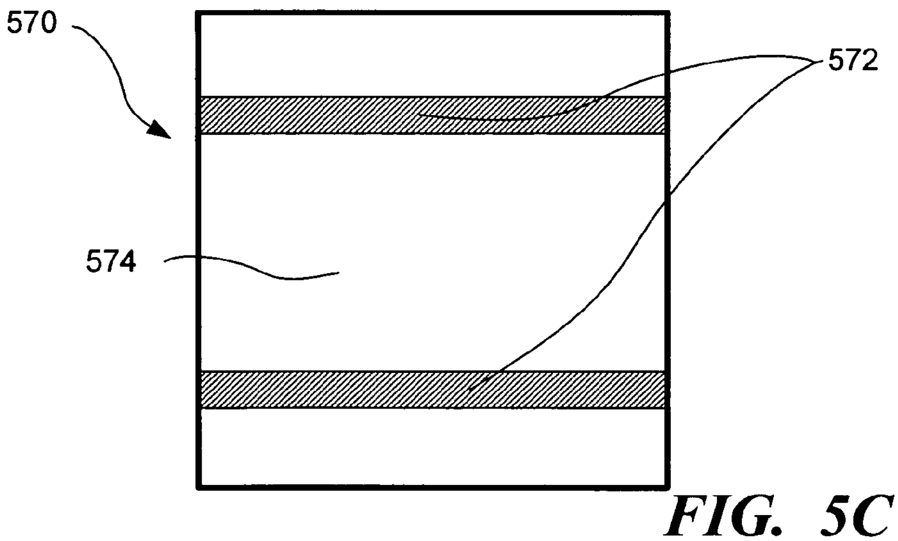
Figure 5D:
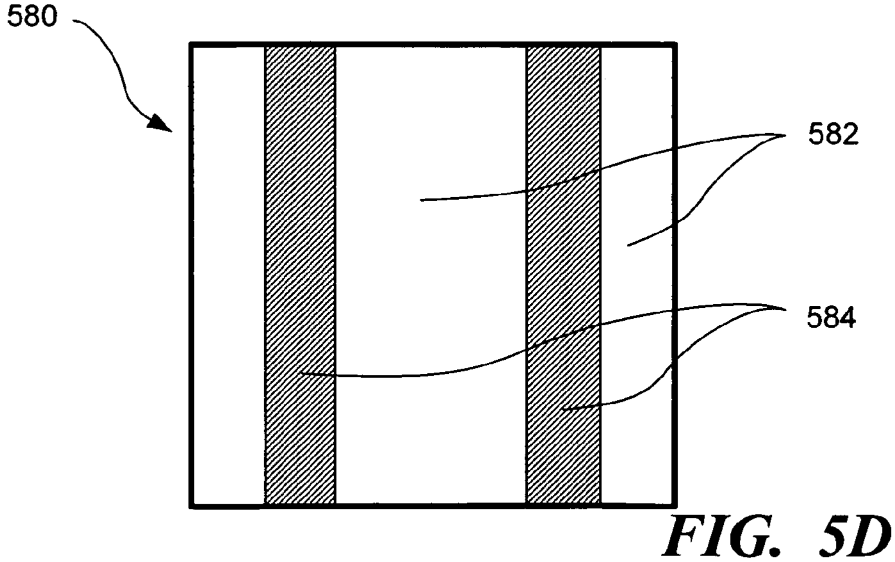

By contrast, in the case of cubemap 500 (FIG. 5A), the presence of concrete walls 540 buttressed by wooden support beams 550 on all faces 510, 560, 570, and 580 will result in a high degree of reflected sound. On left face 560, which is shown in FIG. 5B, concrete wall surfaces 562 are surrounded by wooden support beams 564. On overhead face 570 (FIG. 5C), which is slightly closer to the automobile, more concrete surfaces 572 and more wooden support beams 574 are present. Finally, as shown in FIG. 5D, closest of all to an automobile traveling in a right-hand lane, right face 580 includes more concrete walls 582 and more wooden support beams 584. All these features, as a result of their relative proximity to the automobile, their hardness, and the near field coverage of faces 560, 570, and 580, will reflect sound to a substantial degree.

As described above, while personal computer systems and gaming systems include reverberation engines that enable reverberation of sounds to be modeled, these reverberation engines may require as many as a dozen or more properties to be set in order to control of the reverberation effects. Embodiments of the present invention, however, use the environmental information obtainable from the graphics data to identify features in the computer-generated environment, around successive points of interest, that will reflect sound and derive the reverberation characteristics needed to control a reverberation engine for each point of interest as necessary when the computer generated environment reaches that point of interest.

In one embodiment of the present invention, reverberation characteristics are preferably derived in a pre-processing step. Once the graphics data controlling the appearance of the computer-generated environment have been created, an embodiment of the present invention derives reverberation characteristics for one or more positions of interest in the computer-generated environment. These reverberation characteristics can then be applied when the computer-generated environment is rendered and experienced by a user, so that the sound heard at each location includes a realistic reverberation. In one embodiment of the present invention, reverberation characteristics are derived in preprocessing for a plurality of positions of interest, and when the computer-generated environment is executed, reverberation attributes for a present position of interest are derived by interpolating reverberation characteristics for the present position from a number of proximate positions of interest for which preprocessed reverberation characteristics previously were derived.

Alternatively, in a suitably capable processing system, reverberation characteristics are derivable in real time as the graphics data is rendered for viewing when the computer-generated environment is executed. Reverberation characteristics thus are derived for each specific position of interest. Thus, as changed in the computer-generated environment occur, such as a wall being exploded or otherwise removed from a user, the reverberation characteristics are adjusted accordingly, in real time. It will be appreciated that a real time generation of such reverberation characteristics are derived from the graphics data in a manner comparable to the way that the reverberation characteristics are derived from the graphics data in preprocessing. It also should be appreciated that real time derivation of reverberation characteristics, although increasing demand for computing resources upon executing the computer-generated environment that would be involved in interpolating between predetermined values, will result in reverberation characteristics that may be more accurate to the computer-generated environment than interpolated values derived from preprocessed values.

As is well understood in computer graphics, visually representable features are comprised of a plurality of points. To visually render the features in a meaningful way, each of these points is located at a certain distance relative to the position of the interest from which the features are viewed. As a result, features that appear in the foreground and, thus, in front of other features, and are associated with a particular composition, are associated with a shorter distance relative to the position of interest so that foreground features are rendered in front of background features. In addition, each of the features is associated with a composition type, or texture, so that the features will be rendered in an appropriate shade or color, and will reflect or indicate shadows appropriate to the albedo of the material of which the feature is comprised. In visually rendering such features, a distance from the position of interest to the point is read into a depth buffer for the point, while the reflectance is read into a stencil buffer. These buffers often are joined and make up different portions of a single buffer.

Embodiments of the present invention use the distance to these points and the composition of these points to determine the reverberation characteristics attributable to each. In one embodiment of the present invention, for selected faces of a cubemap, distances to points within a certain lateral range on the cubemap face are determined, and a compositional hardness of each point is also determined. From the distances to the points, the hardness of the points, and the proportion of the surveyed area populated by these points, suitable environmental parameters can be automatically derived. Thus, without an operator manually setting the reverb properties for a myriad of points, an embodiment of the present invention can automatically derive the parameters for one or more positions of interest. Environmental parameters for a plurality of positions of interest, such as along a spline following an expected path through the computer-generated environment, can be derived and stored. Ultimately, upon rendering of the computer-generated environment, reverberation property set values, such as I3DL2 values, can be calculated from these environmental parameters or otherwise retrieved and applied to sounds generated within the computer-generated environment to provide desirable sound reverberation.

Deriving Environmental Parameters Affecting Reverberation of Sound

Figure 6A:
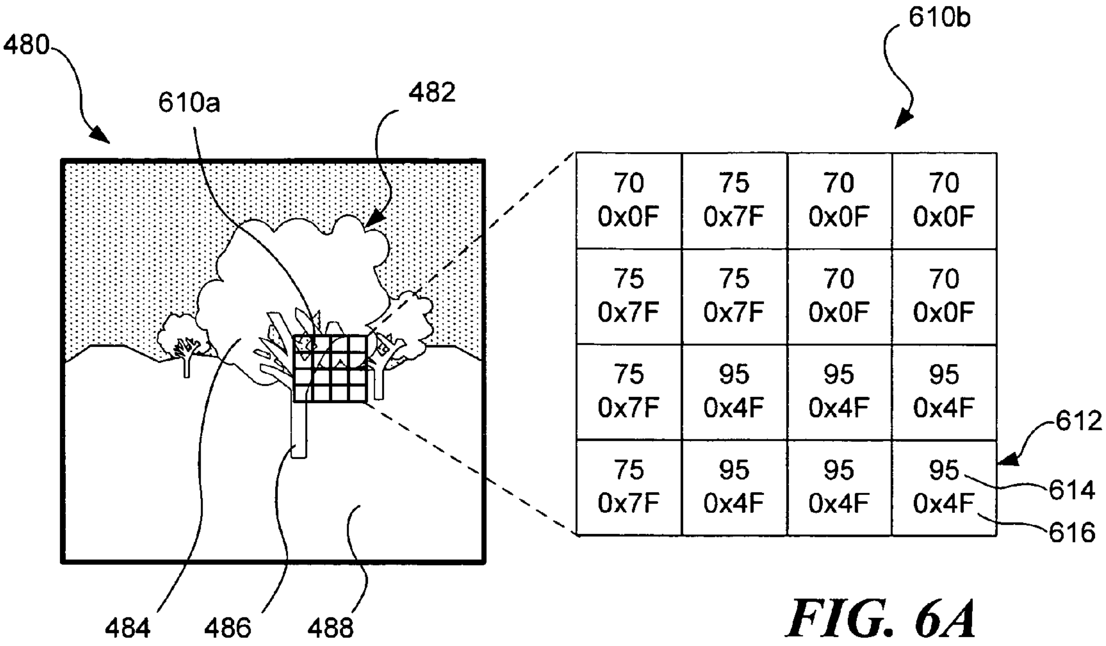
FIGS. 6A-6B are portions of arrays derived from graphics data used to determine environmental parameters surrounding a position of interest.
Figure 6B:
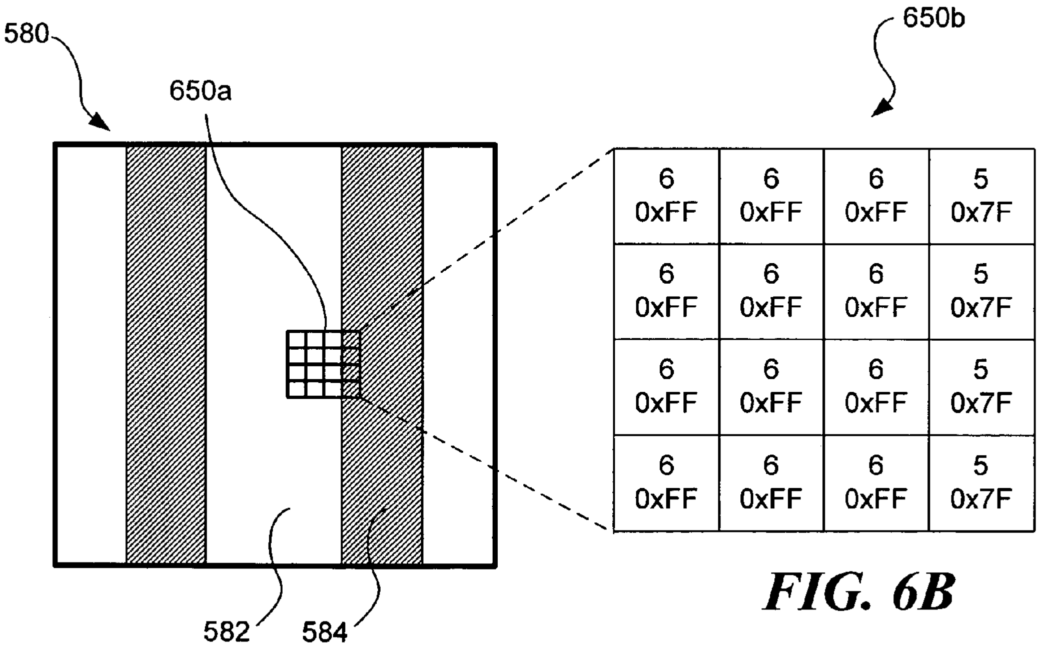

FIGS. 6A and 6B illustrate left faces 480 and 580 of cubemaps 400 and 500, respectively, from which subsets of points have been sampled to determine distances and compositions of features that are represented. More specifically, in FIG. 6A, an array 610*a* represents a subset of points in a plane of left face 480. It will be appreciated that sectors 612 as large as the sectors of array 610*a* each would actually span numerous points, but for purposes of this illustration, it will be assumed that each sector 612 covers only a single pixel or point of face 480. For visual simplicity, array 610*a* is depicted as a four-by-four pixel array; however, in one embodiment of the invention, the array is a 128-by-128 pixel array. It should also be appreciated that an embodiment of the present invention need not visually render graphics data to derive reverberation data from the graphics data. However, for the sake of clarity, face 480 is depicted visually.

Enlarged array 610*b* shows information derived from points in array 610*a*. Specifically, from each sector 612, two figures are derived. A distance 614 indicates the distance from the position of interest to the point. A hardness 616 represents a relative hardness of the material of which the point is composed. Distance 614 actually is a value associated with each point on face 480, whereas hardness value 616 is derived from a texture associated with the point. From the texture associated with each point, a hardness value representative of the material represented by the texture can be substituted. A hardness, in one embodiment of the invention, is an eight-bit value assigned to represent the relative hardness of various compositions. A look-up table may be used that lists hardness values associated with various compositions or textures, as shown in exemplary Table 1, below.

TABLE 1

| TEXTURE/COMPOSITION | HARDNESS |
|---|---|
| Leaf | 0F |
| Bush | 0F |
| ChainLink | 2F |
| Tire | 4F |
| Concrete | FF |
| Grass | 4F |
| Dirt | 5F |
| Wood | 7F |
| Tree | 7F |
| Wall | FF |
| PVC | 7F |
| Gravel | FF |
| Window | FF |
| Crowds | 5F |
| Canvas | 0F |
| Rail | FF |
| Rock | FF |

The hardness values are eight-bit binary values represented as two-digit hexadecimal values. The hardness values, as shown in Table 1, range from a softest value having the least unit reverberation, or 0F (16), to a hardest value having the greatest unit reverberation, or FF (255). In one embodiment of the present invention, the hardness values are scaled to a decimal value in the range between 0.0 and 1.0, where 0.0 represents the softest, least reverberant materials, and 1.0 represents the hardest, most reverberant materials.

Referring back to FIG. 6A, enlarged array 610*b* includes a distance 614 and a hardness 616 for each of the points included in array 610*a*. Enlarged array 610*b* thus represents a sampling of the values associated with features on left face 480 that might affect reverberation of sound. In the sampled area, five pixels include a trunk 486 of a tree 482 at a distance of 75 units and having a hardness of 7F or 127. Six pixels include leafy branches 484 extending outwardly from trees 482 at a distance of 70 units and having a hardness of 0F or 15. The remaining five pixels of array 610*a* include grass in an open terrain 488 behind tree 482 at a distance of 95 units and having a hardness of 4F or 79. The distances and hardness values are read into the depth and stencil buffers.

Referring to FIG. 6B, an array 650*a* spans a four-by-four pixel portion of right face 580, which includes concrete walls 582 supported by wooden beams 584. Array 650*a* spans a portion of right face 580 including points much closer to the position of interest and comprising much harder materials. As shown in an enlarged array 650*b*, 12 of the points covered by array 650*a* include concrete walls at a distance of six units. From Table 1, concrete has a maximum hardness value of FF or 255. Wooden support beams 584 supporting concrete walls 582 are at a distance of five units and have a hardness value of 7F or 127. Again, these distances and hardness values are read into the depth and stencil buffers.

In one embodiment of the present invention, a distance range and a lateral range relative to the position of interest are set to determine the portion of each face that is evaluated. Thus, in order to reduce processing demands, not every point of each face is evaluated, and points at a distance considered too far to affect reverberation are preferably ignored. It is assumed for the sake of the examples shown in FIGS. 6A and 6B that all of the points spanned by arrays 610*a* and 650*a* and which are considered are in a reverberant range, both laterally and in distance.

From the data read into the depth and stencil buffers, intermediate values representing the environment portrayed on the sampled portions of the faces are calculated. In one embodiment of the present invention, these intermediate vales include a mean distance, a mode distance, a median distance, and a mean hardness for each face. The mean distances and mean hardness can be mathematically determined by totaling the values for these parameters that are stored in the depth and stencil buffers, respectively, and dividing by the number of points sampled. For example, the mean distance for points included in array 610*b* is approximately 81 units, and the mean hardness is approximately 92. The mean distance for points included in array 650*b* is 5.75 feet and the mean hardness is 223.

Figure 7A:
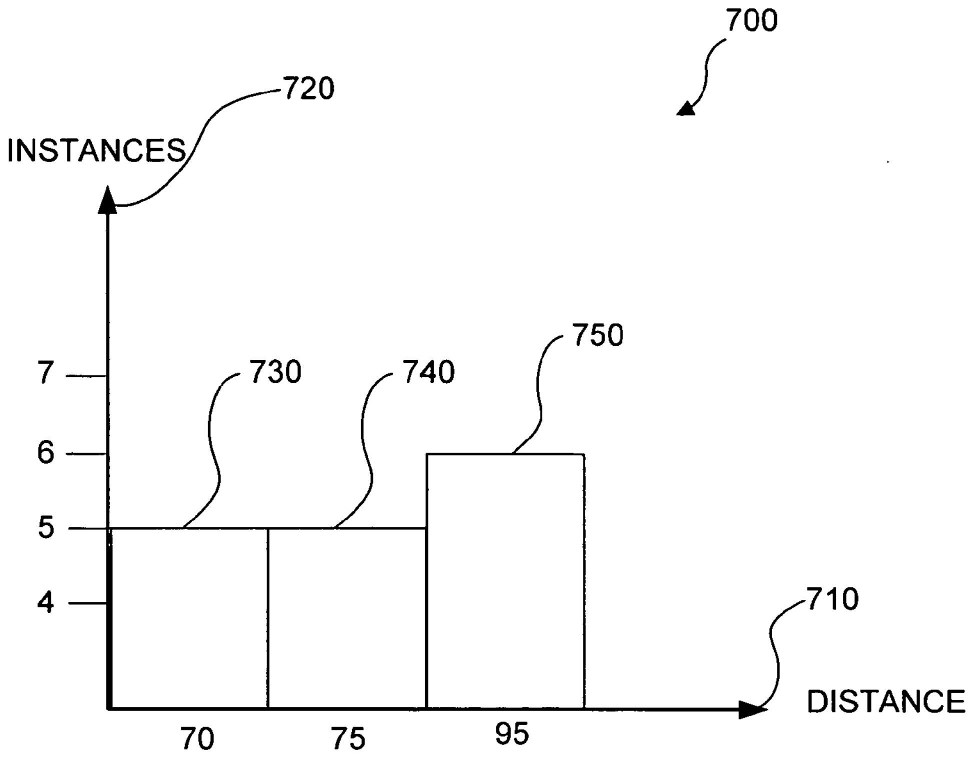
FIGS. 7A-7B are distance or depth histograms used in deriving median and mode distances from the arrays of FIGS. 6A-6B.
Figure 7B:
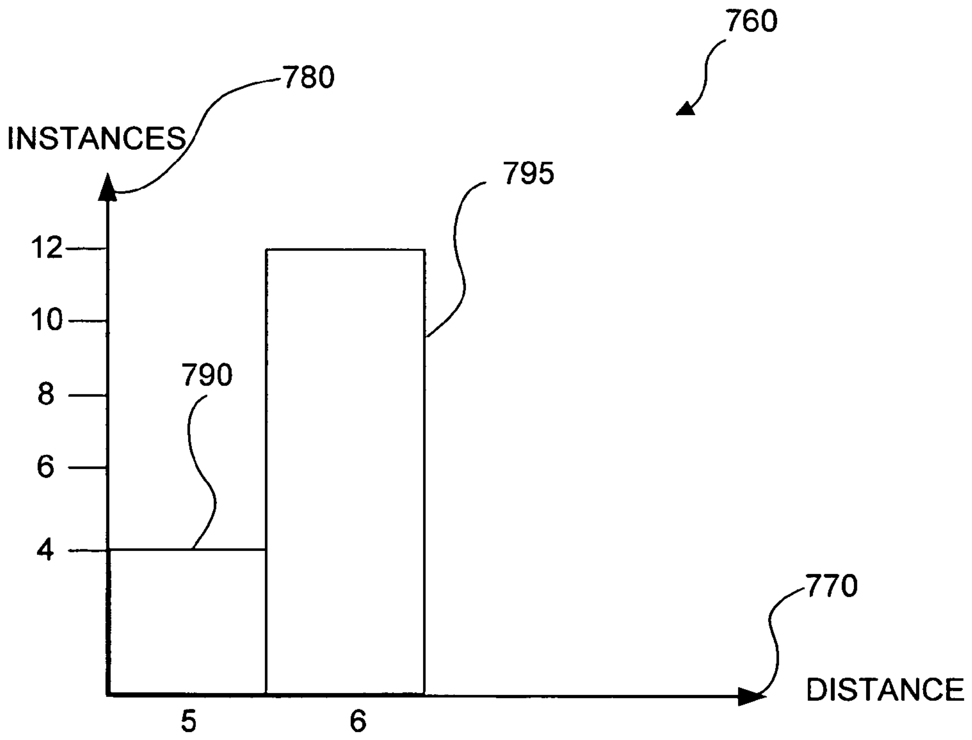

To determine the most represented or mode distance and the median distance, histograms 700 and 760 shown in FIGS. 7A and 7B, respectively, are created to derive intermediate values for each face of the cubemap. Histogram 700 charts values collected from array 610*a* (FIG. 6A), and for each unit distance 710, plots the number of instances 720 of points located at that distance. Histogram 700 shows five instances 730 of points at a distance of 70 units, five additional instances 740 of points at a distance of 75 units, and six instances 750 of points at a distance of 95 units. Thus, the median distance is 75 units and the mode distance is 95 units. Distances analyzed in the histogram may include a plurality of discrete distances, such as 75 units, or distance ranges, such as between 70 and 79 units. Histogram 760 charts values collected from array 650*a* (FIG. 6B), and for each unit distance 770, plots a number of instances 780 of points located at that distance. Histogram 760 shows four instances 790 of points at a distance of five units and 12 instances 795 of points at a distance of six units. The median distance and mode distances are each six units.

Embodiments of the present invention may use histogram analysis to further refine analysis of the computer-generated environment. For example, using information derived from histograms about the computer-generated environment, multiple mode distances may be used to determine distance to multiple features of the computer-generated environment in order to derive reverberation characteristics associated with those multiple features. Thus, as shown in FIG. 7B for example, reverberation characteristics may be derived from features at a first mode distance, where there are 12 instances 795 of points at a distance of six units and from features at a second mode distance where there are four instances 790 of points at a distance of five units. For the points identified at each of those mode distances, hardness histograms may be generated to determine a mode hardness of points at each distance, or multiple mode hardnesses at each distances. Using the relative hardness of the materials, the distance to the points, and/or the proportion of points at each distance, associated with the points, reverberation can be attributed to each of the features identified.

For example, in evaluating the graphics data, it may be determined that a first mode distance range 10-15 meters away from the position of interest, and points at the first mode distance includes 40% of the points being evaluated. A second mode distance may be at a distance range 20-25 meters away from the position of interest, and points at the second mode distance includes 36% of the points being evaluated. For points at the first mode distance, a first composition histogram may indicate that a first mode hardness having a maximum hardness of FF, while at the second mode distance, a second composition histogram may indicate a first mode hardness having a lesser hardness value of CF. From these environmental aspects, reverberation attributable to the points having a first mode hardness at the first mode distance and second mode distance can be determined and used to simulate the reverberation. Alternatively, any desired number of mode distances and/or mode hardnesses at each of these distances, or any desired number of mode hardnesses and/or mode distances for each of these hardnesses, can be used to derive a plurality delay lines to create a more detailed reverberation profile for the computer-generated environment.

In sum, by identifying multiple features in the graphics data and analyzing the composition of and distance to the features, embodiments of the present invention may more closely approximate the manner in which reverberation of sound occurs in the physical world. Thus, although additional processing resources are required in deriving environmental parameters associated with multiple features and/or multiple distances in either preprocessing or real-time processing of the computer-generated environment, a more realistic set of assessment reverberation characteristics may result.

Furthermore, in another embodiment of the present invention, a plurality of reverberation characteristics may be derived for each position of interest. The plurality of reverberation characteristics may correspond to a plurality of aspects of the position of interest, such as left and right sides of the position of interest or forward and rearward faces of the position of interest. As a result, if separate left and right and/or forward and rear audio channels are available, reverberation characteristics can be applied to each of those channels to provide a more vivid or realistic multi-dimensional experience. Thus, for example, if in the computer generated environment, the position of interest includes a wide open space to a left side and a confined space of hard surfaces to the right side, reverberation will be applied to more accurately apply reverberation such that a user will experience more reverberation from a right audio channel than a left audio channel.

To derive the multiple sets of reverberation characteristics corresponding to the different aspects of the position of interest, secondary positions of interest actually may be derived from each position of interest, with reverberation characteristics derived for each of the secondary positions of interest. Thus, using the previous example where the position of interest includes a wide open space to a left side and a confined space of hard surfaces to the right side, a secondary left position of interest may be defined as offset to the left of the position of interest by a predetermined amount, while a secondary right position of interest may be defined as offset to the right of the position of interest by a predetermined amount. By determining the reverberation characteristics for both the secondary left position of interest and secondary right position of interest, appropriate reverberation characteristics may be derived to apply to separate left and right audio channels.

Adjustment of Values Affecting Reverberation

In one embodiment of the present invention, these values are then combined to derive an overall value for selected faces of the cubemap in reaching an overall environmental assessment used in determining the reverberation for the position of interest. In combining selected faces, a total number of points sampled and a total number of points within a prescribed range of distances are counted, as further described below. In one embodiment of the invention, the mean distances and mean hardness determined for each face may be weighted rather than simply based upon an average. For example, in the example of an automobile racing environment, it may be desirable to attribute more reverberation to features looming ahead to allow and enable a user to more realistically sense the effect on sound caused by such features before the features pass from view. Accordingly, features positioned forward toward the direction of expected motion may be assigned a higher weight than those in the other directions, i.e., on the other faces of the cubemap. Similarly, when values from the faces are combined to represent an overall value surrounding the position of interest, values of particular faces may be weighted more heavily. Thus, in the example of the automobile racing game, if it is desirable for dramatic effect (or to provide greater realism) to attribute more reverb to overpasses, overhead signs, and tunnels, the overhead face may be assigned greater weight.

Figure 8A:
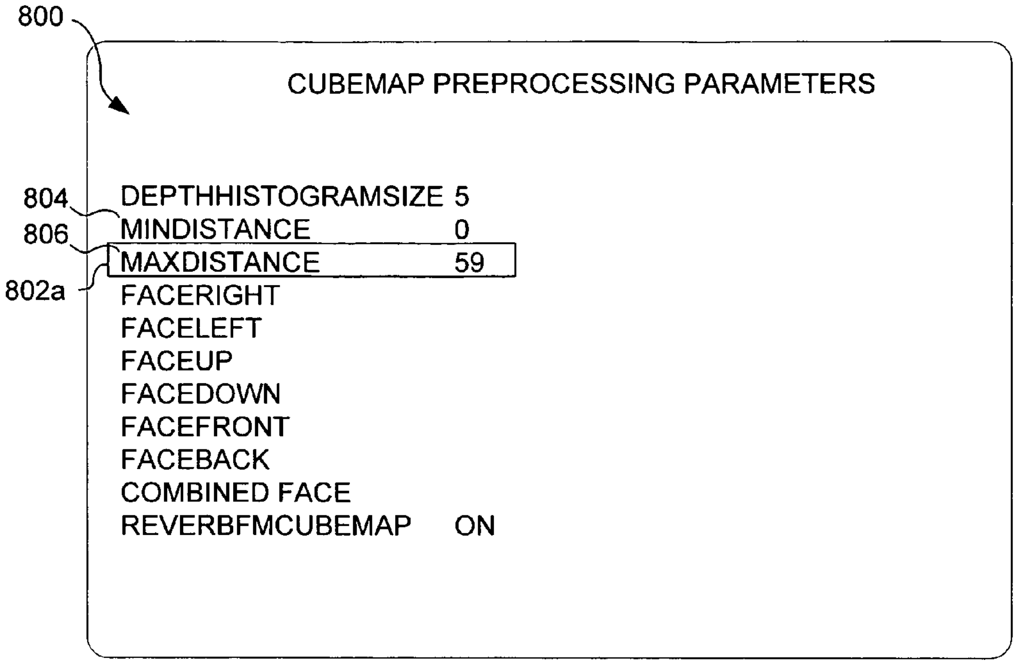
FIGS. 8A-8D are screen shots from an interface enabling an operator to adjust ranges and values used in determining reverberation characteristics.

In one embodiment of the present invention, weights assigned, ranges used in sampling features, and various other variables affecting reverberation may be adjusted by an operator via a user interface. FIGS. 8A-8D show a series of exemplary interface screens listing adjustments an operator might make. More specifically, FIG. 8A shows a "CUBEMAP PREPROCESSING PARAMETERS" screen 800 that represents a top-level menu of options an operator may adjust. A cursor 802*a* identifies an operator selection. Thus, for example, from screen 800, an operator can select options "MINDISTANCE" 804 or "MAXDISTANCE" 806 to adjust a minimum and maximum unit distance from the position of interest, respectively, delineating limits on a scale used in interpolating values, as described below.

Figure 8B:
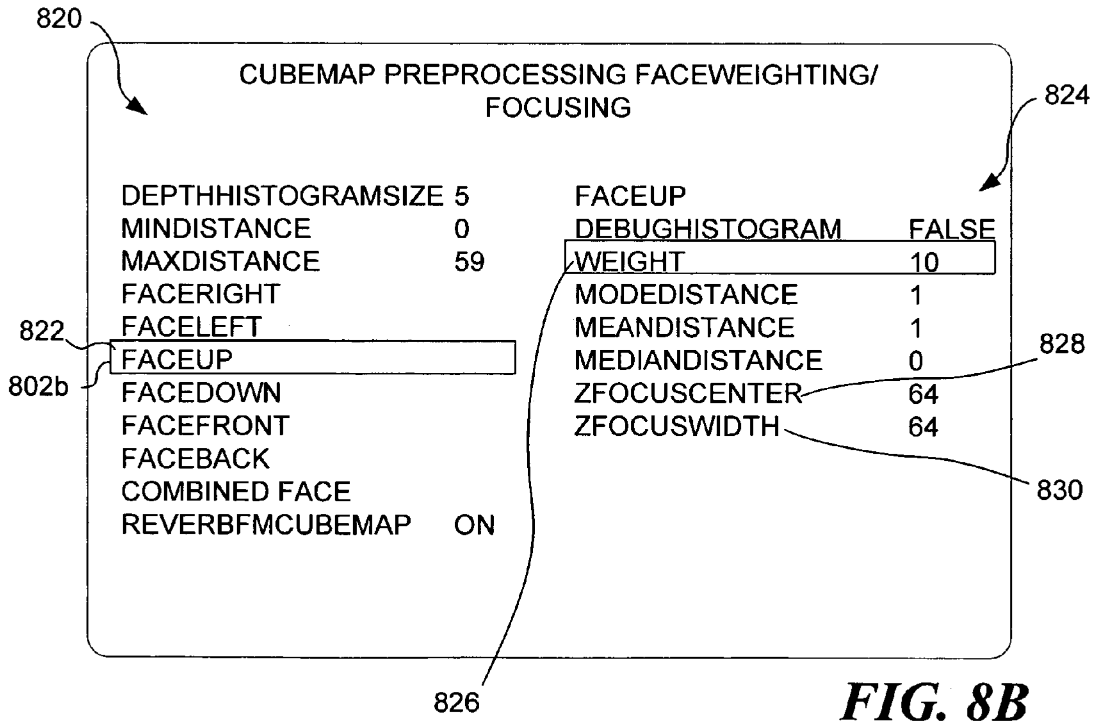

Moving the cursor to some options invokes a submenu enabling values related to the option to be adjusted, as shown in FIG. 8B. A screen 820 is a "CUBEMAP PREPROCESSING FACEWEIGHT/FOCUSING" screen enabling an operator to adjust weights assigned to a particular face and/or portions of that face. Screen 820 is invoked by the operator positioning a cursor 802*b* over a selection 822 representing "FACEUP," which represents the overhead face of the cubemap. Choosing "FACEUP" 822 invokes a submenu 824 listing a number of values the operator can adjust to vary reverberation derived from the overhead face of the cubemap. From submenu 824, the operator can adjust, for example, a weight 826 assigned to the overhead face in computing overall values for the cubemap surrounding the current position of interest. In the example of FIG. 8B, the operator assigns a weight 826 of "10" to provide maximum emphasis on overhead structures in generating reverberation. From submenu 824, a number of other values may also be set, for example, a "ZFOCUSCENTER" 828 and a "ZFOCUSWIDTH" 830 can be set by the operator to indicate where the selected face will be sampled in deriving environmental parameters from the face.

Figure 8C:
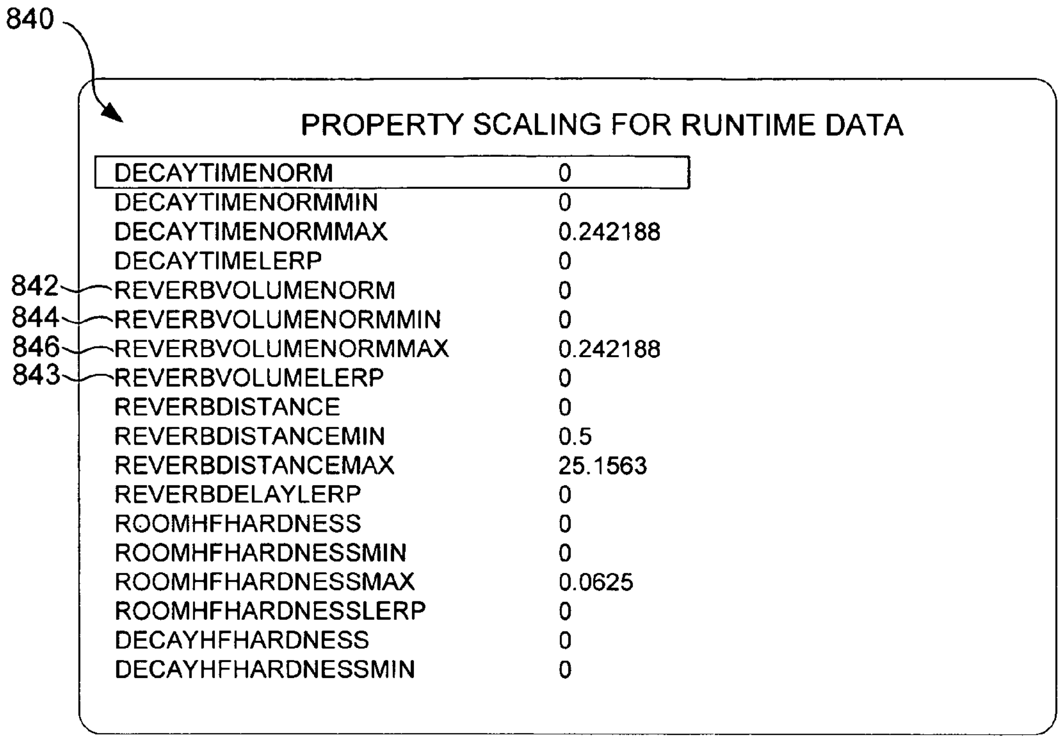
Figure 8D:
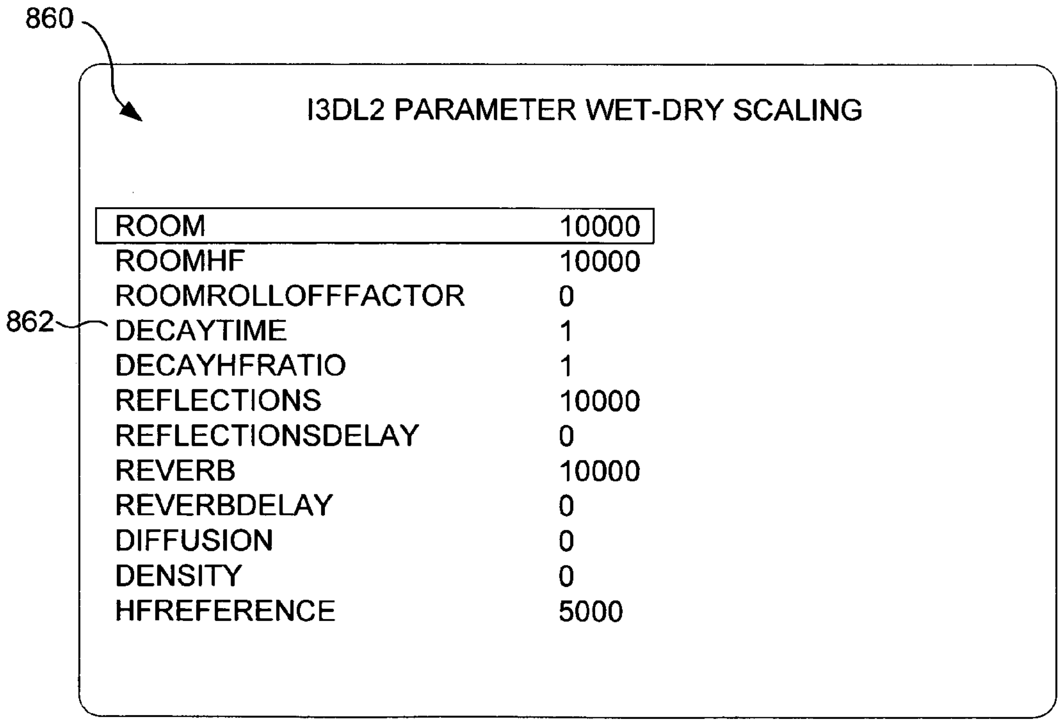

In addition to making adjustments that affect how an embodiment of the present invention will derive values from faces of the cube map, an operator also may tune values of the property set that will determine the reverberation at runtime. FIG. 8C shows a "PROPERTY SCALING FOR RUNTIME DATA" screen 840 enabling the operator to select limits of ranges for various property set values. "REVERBVOLUMENORM" 842 is a value determined in preprocessing that establishes a nominal reverb volume based from the graphics data for a particular preprocessed position. "REVERBVOLUMELERP" 843 is a linear interpolation of "REVERBVOLUMENORM" 842 between "REVERBVOLUMENORMMIN" 844 and "REVERBVOLUMENORMMAX" 846 for each actual position being processed, with "REVERBVOLUMENORMMIN" 842 and "REVERBVOLUMENORMMAX" 844 representing the upper and lower limits, respectively of "REVERBVOLUMELERP" 843. The operator can adjust "REVERBVOLUMENORMIN" 844, and "REVERBVOLUMENORMMAX" 846 to ensure a minimum amount of reverberation and limit the maximum degree of reverberation volume, respectively. In FIG. 8C, "REVERBVOLUMENORMMIN" 844 is set to 0, thus, "REVERBVOLUMELERP" 843 will not yield a value less than 0. "REVERBVOLUMENORMMIN" 844 could be set to any desired level, in one embodiment of the present invention, between 0.0 0.0 and 1.0 that will determine the maximum dryness or maximum wetness, respectively, of the reverb volume attributed to the position being processed. As shown in FIG. 8D, "REVERBVOLUMENORMMAX" 846 is set to 0.242188, thus, "REVERBVOLUMELERP" 843 will not yield a value in excess of 0.24188 for the position being processed. Using "PROPERTY SCALING FOR RUNTIME DATA" screen 840, the operator can thus adjust the values that may be interpolated from the preprocessing data derived from the graphics data for preprocessed positions.

Similarly, FIG. 8D shows an "I3DL2 PARAMETER WET-DRY SCALING" screen 860 that enables the operator to adjust scales of property set values. Values shown on screen 860 generally represent default values. For example, the default for a "DECAYTIME" parameter 862, which reflects the time passing before a sound's reverberation becomes inaudible in the I3DL2 specification is one second, as shown in FIG. 8D. However, the operator can adjust this value to cause the reverberations to become inaudible more quickly or more slowly. The operator also can adjust the other property set value defaults to cause the reverberation to be more "wet" or more "dry" and change other affects.

Logical Steps for Automatically Deriving and Applying Reverberation Parameters

In one embodiment of the present invention, environmental characteristics are derived from cubemaps surrounding a plurality of positions of interest throughout the computer-generated environment. These environmental parameters include the mean distances, mean hardness, median distances, mode distances, number of points evaluated, and number of points in range, as described above, in connection with FIGS. 6A through 7B. These environmental parameters are reverberation characteristics from which reverberation property set values can be computed at runtime. Thus, in one embodiment of the present invention, these environmental parameters are derived from the graphics data describing the computer-generated environment for each of a plurality of positions of interest and are stored in association with the positions of interest, along with the data describing the computer-generated environment. Then, upon execution of the computer-generated environment during runtime, the environmental parameters are retrieved as the graphics data are rendered. From the environmental parameters, reverberation property set values used by I3DL2 specification or other reverberation parameters are derived at runtime. The number of environmental parameters is less than the number of property set values. Therefore, fewer values need to be derived in preprocessing. Further, fewer values need to be stored along with the rest of the data describing the computer-generated environment. Deriving the property set values from the environmental characteristics is computationally simple, and does not overtax the processing capabilities at runtime.

Figure 9:
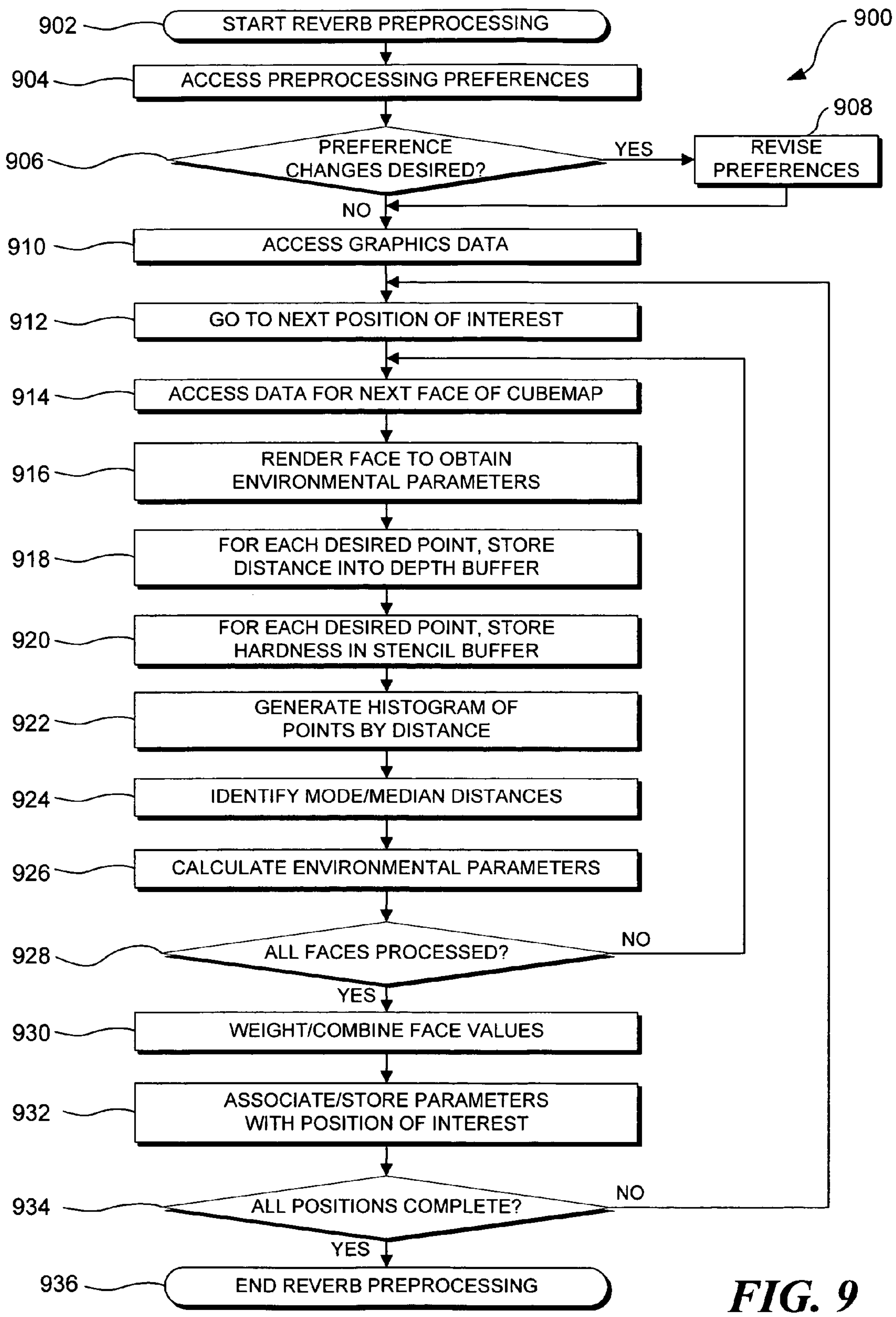
FIG. 9 is a flow diagram illustrating logical steps for preprocessing environmental parameters for a computer-generated environment.

FIG. 9 is a flow diagram 900 illustrating the logical steps for generating the environmental parameters during preprocessing, and FIG. 10 is a flow diagram 1000 illustrating the logical steps for deriving the property set values from the environmental parameters upon execution (i.e., at runtime). If desired, however, the property set values themselves can be derived in preprocessing and stored in association with the positions of interest.

Flow diagram 900 in FIG. 9 begins at a step 902. At a step 904, preprocessing preferences affecting the weighting and tuning of the environmental parameters, are accessed, as described above in connection with FIGS. 8A-8B. At a decision step 906, it is determined if changes in the preferences are desired. If so, at a step 908, an operator can change the default preferences or other preferences previously set. If it is determined at decision step 906 that no changes are desired, or once desired changes are made at step 908, flow diagram 900 proceeds to a step 910, where graphics data describing the computer-generated environment are accessed.

At a step 912, flow diagram 900 accesses a next position of interest in the computer-generated environment. The positions of interest for which environmental parameters are derived can be selected in a number of ways. In one embodiment of the present invention, using the example of an automobile racing simulation, the positions of interest might be chosen to represent a plurality of positions at pre-selected intervals around a race course. For example, the positions of interest might be designated as being spaced apart every two meters from a starting point of the course, through its finish line. At a step 914, data describing a next face of the cubemap for the position of interest are accessed. At a step 916, as described above in connection with FIGS. 5A-7B, data from the face are rendered to derive the environmental parameters. At a step 918, for each desired point (including those within a desired distance and lateral range of the position of interest), the distance to the point is stored in a depth buffer. At a step 920, for each desired point, a hardness value is stored in the stencil buffer. As described above, in one embodiment of the present invention, a lookup table associates a hardness value with each texture of features that may be included in the computer-generated environment. Upon accessing each point, the hardness value is retrieved for the texture and is stored in the stencil buffer.

Once the face has been rendered to store the distance and hardness in the appropriate buffers, at a step 922, distance histograms are generated, as described above in connection with FIGS. 7A and 7B. At a step 924, as also described in connection with FIGS. 7A and 7B, the median and mode distances are determined from the data retrieved from the cubemap face. At a step 926, other environmental parameters for the face, including the mean hardness and mean distance, are calculated.

At a decision step 928, it is determined if all the faces have been processed. If not, flow diagram 900 loops to step 914 to access data for the next face of the cubemap for the current position of interest. On the other hand, if it is determined at decision step 928 that all the cubemap faces for the current position of interest have been processed, at a step 930 the environmental parameters are combined and/or weighted to derive the composite environmental parameters for the current position of interest. At a step 932, the environmental parameters are associated and/or stored in connection with the current position of interest so that the environmental parameters can be retrieved when the computer-generated environment is rendered upon execution.

At a decision step 934, it is determined if preprocessing has been completed for all the positions of interest. If not, flow diagram loops to step 912 where the data for the next position of interest is accessed, and the successive steps are performed for that position of interest, as described above. On the other hand, if it is determined at decision step 934 that preprocessing is complete for all positions of interest, the reverberation preprocessing ends at a step 936.

It should be appreciated that the process described by flow diagram 900 is largely automatic. Environmental parameters from which the property set values can be derived are determined from the graphics data. Operators and designers are enabled to adjust values and repeat preprocessing until they are satisfied with the results. However, operator intervention is not required. The option that enables an operator to selectively modify the automatically selected values is thus very different from conventional methods that require reverberation property set values to be assigned manually throughout the computer-generated environment.

Derivation of environmental parameters as described in connection with FIGS. 6A-6B, 7A-7B, and 9 is computationally straightforward. As described above, values are derived for each desired cube face for a position of interest:

```
struct REVERB__CUBE__FACE
{
    float m__fMeanDistance;
    float m__fModeDistance;
    float m__fMedianDistance;
    float m__fMeanHardness;
};
```

From the data for each cube face, the values are combined to determine overall environmental parameters:

```
struct REVERB__COMBINED__DATA
{
    float m__fMeanDistance;
    float m__fModeDistance;
    float m__fTopModeDistance;
    float m__fMeanHardness;
    int  m__nTotalSamples;        // 128×128×6 possible pixels
    int  m__nInRangeSamples;      // 128×128×6 possible pixels
how many are in range
};
```

It will be appreciated that, in one embodiment of the invention, it may be desirable to emphasize reverberation for overhead structures appearing on overhead cubemap faces for dramatic effect. Accordingly, a mode distance for the overhead face, "TopModeDistance" may be included in the overall derivation to ensure emphasis to be attributed to a most-commonly occurring distance of features appearing overhead. As described above, data for each face is partially derived using straightforward histogramatic analysis:

```
struct PER__FACE__DATA
{
    float m__fFaceWeight;
    int  m__nCarZFocusCenter; // pixel along car Z that is Most important
    to reverb
    int  m__nCarZFocusWidth; // pixels along car Z that is are used
for reverb; outside of width from center pixels are ignored
    bool m__bSpewNextHistogram;
    CDepthHistogram m__DepthHistogram;
    CDepthHistogram m__HardnessHistogram;
    int m__nDepthMode;
    float m__fDepthModeNormInv; // 0.0 = far; 1.0 = near
    // do frequency analysis on depth histogram
    CDepthHistogram m__freqhist;
    int m__nMode0Class;
    float m__fMode0Frequency; // the frequency that occurs most often
    in depth
    int m__nMode1Class;
    float m__fMode1Frequency;
    REVERB__CUBE__FACE m__Results;
};
```

With the reverberation characteristics being derivable from the environmental parameters that were automatically determined and stored according to flow diagram 900, reverberation property set values are readily generated at runtime according to the logical steps illustrated in flow diagram 1000 of FIG. 10. Flow diagram 1000 begins at a step 1002. At a step 1004, the location of the current position within the computer-generated environment is determined. At a step 1006, environmental parameters stored in association with preprocessed positions of interest are accessed. At a decision step 1008, it is determined if environmental parameters were preprocessed and stored for the current position. If so, at a step 1010, the environmental parameters are retrieved. On the other hand, if it is determined at decision step 1008 that environmental parameters were not preprocessed and stored for the current position, at a step 1012, the two closest positions for which environmental parameters were preprocessed are identified. At a step 1014, environmental parameters for each of the two closest positions are then retrieved. At a step 1016, the retrieved environmental parameters are interpolated to derive environmental parameters for the current position. In one embodiment of the present invention, the environmental parameters retrieved are interpolated linearly as a function of a relative distance from the current position of interest to each of the closest positions for which environmental values are available.

Regardless of whether the environmental parameters were preprocessed and simply retrieved for the position of interest at step 1010 or were determined by interpolation at step 1016, at a step 1018, the reverberation property set values are calculated. In one embodiment of the present invention, the reverberation property set values are derived by linear interpolation. As described in connection with FIGS. 8A-8D, an operator can set reverberation values to range from the values for an idealized large open space, where no surfaces exist that will cause reverberation of sound, to the values for a small closed space where sound readily reverberates. By setting the limits as described above for maximum reverberation, maximum distances, and similar values, reverberation property set values can thus be calculated by interpolating the property set values according to environmental parameters with which the property set values are associated.

In one embodiment of the present invention, interpolation is performed using a conventional linear interpolation. For example, a "LerpClamp" routine may be invoked to determine linear interpolation, based on provided values between a predetermined minimum and maximum:

```
//Linearly interpolates and clamps an f32 value such that:
//if(inVal < inMin) return outMin
//else if(inVal > inMax) return outMax
//else interpolate the value
f32 LerpClampF32(f32 inVal, f32 inMin, f32 inMax, f32 outMin, f32
outMax)
{
    //Validate data
   CheckMinMaxF32( inMin, inMax);
    //MAssert(inMin <= inMax);
    //If we should clamp low
    if(inVal <= inMin)
    {
      return outMin;
    }
   else if(inVal >= inMax) //If we should clamp high
   {
      return outMax;
   }
   else //We should interpolate
   {
      return LerpF32(outMin, outMax, (inVal - inMin) / (inMax -
      inMin));
   }
}
//Returns the linear interpolation of two f32 values, based on the
interpolant f32 LerpF32(f32 val0, f32 val1, f32 interpolant)
{
   return val0 + (interpolant * (val1 - val0));
}
Using LerpClamp or a similar routine and the appropriate arithmetic
calculations, reverberation property set values are derived from
environmental parameters determined by pre-processing (as shown in FIG.
9):
   void CAudioReverb::UpdateReverbFromSplinePoint( REVERB__
COMBINED__DATA & reverbpoint)
  {
   ////////////////////////////////////////////////////////////////////
   // compute lerps from big open(0.0) space to small closed space(1.0)
   m__Cubemap.m__CombinedData = reverbpoint;
     // decay time longer for more pixels in audible range
     m__fDecayTimeNorm=reverbpoint.m__nInRangeSamples
   /float(reverbpoint.m__nTotalSamples);
     // reverb louder for more pixels in predetermined audible range or
     m__fReverbVolumeNorm=reverbpoint.m__nInRangeSamples
/float(reverbpoint.m__nTotalSamples);
        // reverb delay longer for further mean distance
        m__fReverbDistance = reverbpoint.m__fMeanDistance;
        // rever HF ratios so harder surfaces reflect HF more
```

-continued

```
        m__fRoomHFHardness = reverbpoint.m__fMeanHardness;
        // rever HF ratios so harder surfaces reflect HF more
        m__fDecayHFHardness = reverbpoint.m__fMeanHardness;
          m__fDecayTimeLerp=LerpClampF32(m__fDecayTimeNorm,
m__fDecayTimeNormMin, m__fDecayTimeNormMax, 0.0f, 1.0f);
          m__fReverbVolumeLerp=LerpClampF32(m__fReverbVolumeNorm,
m__fReverbVolumeNormMin, m__fReverbVolumeNormMax, 0.0f, 1.0f);
        m__fReverbDelayLerp=1.0f - LerpClampF32(m__fReverbDistance,
m__fReverbDistanceMin, m__fReverbDistanceMax, 0.0f, 1.0f);
        m__fRoomHFHardnessLerp=LerpClampF32(m__fRoomHFHardness,
m__fRoomHFHardnessMin, m__fRoomHFHardnessMax, 0.0f, 1.0f);
        m__fDecayHFHardnessLerp=LerpClampF32(m__
fDecayHFHardness, m__fDecayHFHardnessMin, m__
fDecayHFHardnessMax, 0.0f, 1.0f);
   // start with current reverb settings
     DSI3DL2LISTENER environment = g__AudioCore.m__Reverb.m__
     dl2Current;
     // adjust delays and decay based on distance info
     environment.flDecayTime=LerpF32(m__dl2DrySpace.flDecayTime,
m__dl2WetSpace.flDecayTime, m__fDecayTimeLerp);
     environment.lReflections=LerpF32(m__dl2DrySpace.lReflections,
m__dl2WetSpace.lReflections, m__fReverbVolumeLerp);
     environment.flReflectionsDelay=LerpF32(m__
dl2DrySpace.flReflectionsDelay, m__dl2WetSpace.flReflectionsDelay,
m__fReverbDelayLerp);
     environment.lReverb=LerpF32(m__dl2DrySpace.lReverb,           m__
dl2WetSpace.lReverb, m__fReverbVolumeLerp);
     environment.flReverbDelay=LerpF32(m__
dl2DrySpace.flReverbDelay, m__dl2WetSpace.flReverbDelay, m__
fReverbDelayLerp);
     // adjust HF ratios based on hardness info
     environment.lRoomHF=LerpF32(m__dl2DrySpace.lRoomHF,
m__dl2WetSpace.lRoomHF, m__fRoomHFHardnessLerp);
     environment.flDecayHFRatio=LerpF32(m__
dl2DrySpace.flDecayHFRatio, m__dl2WetSpace.flDecayHFRatio, m__
fDecayHFHardnessLerp);
     g__AudioCore.m__Reverb.SetEnvironment( environment );
  }
```

The reverberation for each position of interest can thus readily be determined at runtime as the user moves about in the computer-generated environment. The results are consistent and realistic, and more importantly, are determined without requiring manual setting of parameters for each potential position of interest in the environment. Accordingly, a substantial savings in labor is achieved, and the resulting reverberation effects heard at runtime are typically much more realistic.

Exemplary Computing System for Implementing Present Invention

With reference to FIG. 11, an exemplary system suitable for implementing various portions of the present invention is shown. The system includes a general purpose computing device in the form of a conventional PC 1120, provided with a processing unit 1121, a system memory 1122, and a system bus 1123. The system bus couples various system components including the system memory to processing unit 1121 and may be any of several types of bus structures, including a memory bus or memory controller, a peripheral bus, and a local bus using any of a variety of bus architectures. The system memory includes read only memory (ROM) 1124 and random access memory (RAM) 1125. A basic input/output system (BIOS) 1126, containing the basic routines that help to transfer information between elements within the PC 1120, such as during start up, is stored in ROM 1124. PC 1120 further includes a hard disk drive 1127 for reading from and writing to a hard disk (not shown), a magnetic disk drive 1128 for reading from or writing to a removable magnetic disk 1129, and an optical disk drive 1130 for reading from or writing to a removable optical disk 1131, such as a compact disk-read only memory (CD-ROM) or other optical media.

Hard disk drive 1127, magnetic disk drive 1128, and optical disk drive 1130 are connected to system bus 1123 by a hard disk drive interface 1132, a magnetic disk drive interface 1133, and an optical disk drive interface 1134, respectively. The drives and their associated computer readable media provide nonvolatile storage of computer readable machine instructions, data structures, program modules, and other data for PC 1120. Although the exemplary environment described herein employs a hard disk, removable magnetic disk 1129, and removable optical disk 1131, it will be appreciated by those skilled in the art that other types of computer readable media, which can store data and machine instructions that are accessible by a computer, such as magnetic cassettes, flash memory cards, digital video disks (DVDs), Bernoulli cartridges, RAMs, ROMs, and the like, may also be used in the exemplary operating environment.

A number of program modules may be stored on the hard disk, magnetic disk 1129, optical disk 1131, ROM 1124, or RAM 1125, including an operating system 1135, one or more application programs 1136, other program modules 1137, and program data 1138. A user may enter commands and information in PC 1120 and provide control input through input devices, such as a keyboard 1140 and a pointing device 1142. Pointing device 1142 may include a mouse, stylus, wireless remote control, or other pointer. Other input devices (not shown) may include a microphone, joystick, haptic joystick, yoke, foot pedals, game pad, satellite dish, scanner, camera, or the like. These and other input/output (I/O) devices are often connected to processing unit 1121 through an I/O device interface 1146 that is coupled to the system bus 1123. The term I/O interface is intended to encompass each interface specifically used for a serial port, a parallel port, a game port, a keyboard port, a Firewire (IEEE 1394) port, and/or a universal serial bus (USB) interface. A display 1147 can be connected to system bus 1123 via an appropriate interface, such as a video graphics adapter 1148. It will be appreciated that PCs are often coupled to other peripheral output devices (not shown), such as speakers (through a sound card or other audio interface—not shown) and printers.

The present invention may be practiced on a single machine, although PC 1120 can also operate in a networked environment using logical connections to one or more remote computers, such as a remote computer 1149. Remote computer 1149 may be another PC, a server (which is typically generally configured much like PC 1120), a router, a network PC, a peer device, or a satellite or other common network node, and typically includes many or all of the elements described above in connection with PC 1120, although only an external memory storage device 1150 has been illustrated in FIG. 11. The logical connections depicted in FIG. 11 include a local area network (LAN) 1151 and a wide area network (WAN) 1152. Such networking environments are common in offices, enterprise wide computer networks, intranets, and the Internet.

When used in a LAN networking environment, PC 1120 is connected to LAN 1151 through a network interface or adapter 1153. When used in a WAN networking environment, PC 1120 typically includes a modem 1154, or other means such as a cable modem, Digital Subscriber Line (DSL) interface, or an Integrated Service Digital Network (ISDN) interface for establishing communications over WAN 1152, such as the Internet. Modem 1154, which may be internal or external, is connected to the system bus 1123 or coupled to the bus via I/O device interface 1146, i.e., through a serial port. In a networked environment, program modules, or portions thereof, used by PC 1120 may be stored in the external memory storage device 1150. It will be appreciated that the network connections shown are exemplary and other means of establishing a communications link between the computers may be used, such as wireless communication and wide band network links.

Although the present invention has been described in connection with the preferred form of practicing it and modifications thereto, those of ordinary skill in the art will understand that many other modifications can be made to the present invention within the scope of the claims that follow. Accordingly, it is not intended that the scope of the invention in any way be limited by the above description, but instead be determined entirely by reference to the claims that follow.

The invention in which an exclusive right is claimed is defined by the following:

1. A computer implemented method for deriving reverberation characteristics for a computer-generated environment from graphics data that are used by a computing system having a processor and reverberation engine for visually displaying contents of the computer-generated environment, comprising the computing system performing steps of:

(a) selecting a position of interest in the computer-generated environment;

(b) accessing the graphics data that are used for displaying at least a portion of the computer-generated environment viewable from the position of interest when the computer-generated environment is rendered; and (c) automatically deriving reverberation characteristics for the position of interest from the graphics data for each of a plurality of points in the portion of the computer-generated environment, the reverberation characteristics being derived at least in part from:

(i) a distance of the point from the position of interest; and (ii) a hardness value associated with the point, the hardness value indicating a relative level of acoustic reflectance that is associated with the point~wherein the reverberation characteristics include a plurality of environmental parameters from which the property set values are calculable when the computer-generated environment is rendered, and wherein the environmental parameters for the points include at least two of:

a mean distance to the points from the position of interest;

a mode distance to the points from the position of interest;

a median distance to the points from the position of interest;

a mean hardness value associated with the points; and a total number of points in the portion of the computer-generated environment.

2. The method of claim 1, wherein the property set values are configured to be supplied to a reverberation engine that conforms to at least one of:

(a) a IA3DL2 specification; and (b) a EAX specification.

3. The method of claim 1, further comprising the step of identifying a subset of the points describing the portion of the computer-generated environment viewable from the position of interest, the subset including points within at least one of:

(a) a predefined distance range from the position of interest; and (b) a lateral range relative to the position of interest.

4. The method of claim 1, further comprising the step of identifying a plurality of subsets of points describing the portion of the computer-generated environment, each of the plurality of subsets of points including points at:

(a) a plurality of mode distances from the position of interest; and (b) a plurality of mode hardnesses of points at a particular distance.

5. The method of claim 4, wherein separate delay lines relating to each of the plurality of subsets of points are used in developing the reverberation characteristics for the position of interest.

6. The method of claim 3, wherein the environmental parameters further include a total number of points within the subset.

7. The method of claim 6, further comprising the step of deriving, in proportion to the total number of points within the subset to the total number of points, a portion of the property set values that includes at least one of:

(a) a reverb decay time; and (b) a reverb volume.

8. The method of claim 1, further comprising the step of deriving, in proportion to the mean hardness value associated with the points, a portion of the property set values that includes at least one of:

(a) a decay high frequency ratio;

(b) a room high frequency attenuation; and (c) a reflection delay time.

9. The method of claim 1, further comprising the step of deriving, in proportion to distances from the position of interest to the points, a portion of the property set values that includes at least one of:

(a) a decay time;

(b) a reflection intensity;

(c) a reflection delay time; and (d) a reverb intensity.

10. The method of claim 1, wherein the graphics data include a cubemap describing the visually displayable contents of the computer-generated environment that are viewable from the position of interest, and wherein the reverberation characteristics for the position of interest are based on points representable on at least one of the faces of the cubemap.

11. The method of claim 10, wherein the reverberation characteristics derived from any face of the cubemap are weighted according to at least one of:

(a) a face of the cubemap with which a point is associated; and (b) a position within the face with which the point is associated.

12. The method of claim 1, wherein the hardness value is derivable from a feature in the computer-generated environment with which the point is associated.

13. The method of claim 1, wherein the hardness value is retrieved from a hardness value table listing hardness values associated with materials comprising features potentially included in the computer-generated environment.

14. The method of claim 1, further comprising the step of automatically deriving a plurality of reverberation characteristics for the position of interest from the graphics data corresponding to a plurality of aspects of the position of interest and applying each of the plurality of reverberation characteristics to audio channels presented upon execution of the computer-generated environment corresponding to the aspects of the position of interest.

15. The method of claim 14, wherein the plurality of reverberation characteristics for the position of interest are determined by identifying a plurality of secondary positions of interest corresponding to the aspects of the position of interest and determining the reverberation characteristics for each of the secondary positions of interest.

16. The method of claim 14, wherein the aspects of the position of interest correspond to at least one of:

(a) lateral sides of the position of interest; and (b) forward and rearward faces of the position of interest.

17. The method of claim 1, further comprising the step of deriving the reverberation characteristics in a pre-processing step performed before the computer-generated environment is visually rendered.

18. The method of claim 17, wherein the distance from the position of interest to each of the plurality of points is stored in a depth buffer and the hardness of each of the plurality of points is stored in a stencil buffer.

19. The method of claim 17, further comprising the step of storing the reverberation characteristics with the position of interest such that the reverberation characteristics associated with the position of interest are retrievable when the computer-generated environment is visually rendered upon execution.

20. The method of claim 17, further comprising the step of calculating a series of reverberation characteristics for a plurality of positions of interest within the computer-generated environment, the plurality of positions including at least one of:

(a) a plurality of positions selected by an operator; and (b) a plurality of positions at predetermined intervals along an exemplary path through the computer-generated environment.

21. The method of claim 20, further comprising the step of deriving reverberation characteristics for an additional position for which the reverberation characteristics were not previously calculated, by interpolating the reverberation characteristics for at least two other positions of interest that are proximate to the additional position.

22. The method of claim 1, further comprising the step of enabling an operator to selectively adjust at least one of:

(a) allowable ranges of the property set values; and (b) operands used in deriving the property set values from the reverberation characteristics.

23. The method of claim 1, further comprising the step of adjusting reverberation for the position of interest to provide a desired effect, by using reverberation characteristics for an alternate position of interest that is one of:

(a) ahead of the position of interest in the computer-generated environment; and (b) behind the position of interest in the computer-generated environment.

24. A memory medium having machine executable instructions stored for carrying out the steps of claim 1.

25. A computer-implemented method for deriving reverberation characteristics from data used by a computing system having a processor and reverberation engine for visually displaying a computer-generated environment, comprising the computing system performing steps of:

(a) identifying a plurality of positions of interest within the computer-generated environment;

(b) preprocessing the computer-generated environment before the computer-generated environment is visually rendered, to access cubemaps from the data used for visually displaying at least a portion of the computer-generated environment viewable from each of the positions of interest when the computer-generated environment is rendered, a plurality of cubemaps being used for the plurality of positions of interest;

(c) deriving reverberation characteristics for each position of interest from each of a plurality of points in the cubemap for the position of interest, the reverberation characteristics being derived at least in part from:

(i) a distance from the position of interest; and (ii) a hardness value associated with the point, said hardness value being indicative of an acoustic reflectivity at the point; and (d) storing the reverberation characteristics in association with each position of interest such that the reverberation characteristics are retrievable when the computer-generated environment is visually rendered upon execution; and wherein the reverberation characteristics include a plurality of environmental parameters from which the property set values are calculable when the computer-generated environment is rendered, and wherein the environmental parameters for the points include at least two of:

a mean distance to the points from the position of interest;

a mode distance to the points from the position of interest;

a median distance to the points from the position of interest;

a mean hardness value associated with the points; and a total number of points in the portion of the computer-generated environment.

26. The method of claim 25, wherein the reverberation characteristics include at least one of:

(a) property set values usable by a reverberation engine; and (b) a plurality of environmental parameters from which the property set values are calculable when the computer-generated environment is rendered.

27. The method of claim 26, wherein the property set values are configured to be supplied to a reverberation engine that conforms to at least one of:

(a) an IA3DL2 specification; and (b) an EAX specification.

28. The method of claim 26, wherein the environmental parameters for the points include at least one of:

(a) a mean distance from the position of interest to the points;

(b) a mode distance from the position of interest to the points;

(c) a median distance from the position of interest to the points;

(d) a mean hardness associated with the points; and (e) a total number of points in the portion of the computer-generated environment.

29. The method of claim 28, further comprising the step of identifying a subset of the points describing the portion of the computer-generated environment viewable from the position of interest, the subset including points within at least one of:

(a) a distance range from the position of interest; and (b) a lateral range relative to the position of interest.

30. The method of claim 28, further comprising the step of identifying a plurality of subsets of points describing the portion of the computer-generated environment, each of the plurality of subsets of points including points at:

(c) a plurality of mode distances from the position of interest; and (d) a plurality of mode hardnesses of points at a particular distance.

31. The method of claim 30, wherein separate delay lines relating to each of the plurality of subsets of points are used in developing the reverberation characteristics for the position of interest.

32. The method of claim 29, wherein the environmental parameters further include a total number of points within the subset.

33. The method of claim 32, further comprising the step of deriving, in proportion to the total number of points within the subset to the total number of points, a portion of the property set values that includes at least one of:

(a) a reverb decay time; and (b) a reverb volume.

34. The method of claim 28, further comprising the step of deriving, in proportion to the mean hardness of the points, a portion of the property set values that includes at least one of:

(a) a decay high frequency ratio;

(b) a room high frequency attenuation; and (c) a reflections delay time.

35. The method of claim 28, further comprising the step of deriving, in proportion to distances from the position of interest to the points, a portion of the property set values that includes at least one of:

(a) a decay time;

(b) a reflection intensity;

(c) a reflection delay time; and (d) a reverb intensity.

36. The method of claim 25, wherein the reverberation characteristics derived from each of a plurality of faces within a cubemap is weighted according to at least one of:

(a) a face of the cubemap with which the point is associated; and (b) a position within the face of the cubemap with which the point is associated.

37. The method of claim 25, wherein the hardness value is derivable from a feature with which the point is associated.

38. The method of claim 25, wherein the hardness value is retrieved from a hardness value table listing hardness values associated with materials comprising features potentially included in the computer-generated environment.

39. The method of claim 25, further comprising the step of automatically deriving a plurality of reverberation characteristics for the position of interest from the graphics data corresponding to a plurality of aspects of the position of interest and applying each of the plurality of reverberation characteristics to audio channels presented upon execution of the computer-generated environment corresponding to the aspects of the position of interest.

40. The method of claim 39, wherein the plurality of reverberation characteristics for the position of interest are determined by identifying a plurality of secondary positions of interest corresponding to the aspects of the position of interest and determining the reverberation characteristics for each of the secondary positions of interest.

41. The method of claim 39, wherein the aspects of the position of interest correspond to at least one of:

(c) lateral sides of the position of interest; and (d) forward and rearward faces of the position of interest.

42. The method of claim 25, wherein the distance from the position of interest to each of the plurality of points is stored in a depth buffer, and wherein the hardness of each of the plurality of points is stored in a stencil buffer.

43. The method of claim 25, wherein the plurality of positions of interest are identified according to at least one of:

(a) an operator selection; and (b) a predetermined interval along an exemplary path through the computer-generated environment.

44. The method of claim 25, further comprising the step of deriving reverberation characteristics for an additional position for which the reverberation characteristics were not previously calculated, by interpolating the reverberation characteristics for at least two other positions of interest that are proximate to the additional position.

45. The method of claim 26, further comprising the step of enabling an operator to selectively adjust at least one of:

(a) allowable ranges of the property set values; and (b) operands used in deriving the property set values from the reverberation characteristics.

46. The method of claim 25, further comprising the step of adjusting reverberation for the position of interest to achieve a desired effect, by using reverberation characteristics for an alternate position of interest that is one of:

(a) ahead of the position of interest in the computer-generated environment; and (b) behind the position of interest in the computer-generated environment.

47. A memory medium having machine executable instructions stored for carrying out the steps of claim 25.

48. A system for deriving reverberation characteristics for a computer-generated environment from graphics data used for visually displaying the computer-generated environment, comprising:

(a) at least one user input device;

(b) a display screen;

(c) a processor in communication with the input device and the display screen; and (d) a memory in communication with the processor, the memory storing data and machine instructions that cause the processor to carry out a plurality of functions, including:

(i) selecting a position of interest in the computer-generated environment;

(ii) accessing the graphics data used for displaying at least a portion of the computer-generated environment viewable from the position of interest when the computer-generated environment is rendered; and (iii) deriving reverberation characteristics for the position of interest from the graphics data describing each of a plurality of points in the portion of the computer-generated environment, the reverberation characteristics being derived at least in part from:

(A) a distance from plurality of points to the position of interest; and (B) a hardness value associated with the point, said hardness value being indicative of an acoustic reflectivity at the point wherein the reverberation characteristics include at least one of:

(a) property set values usable by a reverberation engine; and (b) a plurality of environmental parameters from which the property set values are calculable when the computer-generated environment is rendered, and wherein the environmental parameters for the points include at least two of:

a mean distance to the points from the position of interest; a mode distance to the points from the position of interest; a median distance to the points from the position of interest; a mean hardness value associated with the points; and a total number of points in the portion of the computer-generated environment.

49. The system of claim 48, wherein the property set values are configured to be supplied to a reverberation engine conforming to at least one of:

(a) an IA3DL2 specification; and (b) an EAX specification.

50. The system of claim 48, wherein the machine instructions stored in the memory further cause the processor to identify a subset of the points for the portion of the computer-generated environment viewable from the position of interest, the subset including points within at least one of:

(a) a distance range from the position of interest; and (b) a lateral range relative to the position of interest.

51. The system of claim 50, wherein the machine instructions stored in the memory further cause the processor to identify a plurality of subsets of points describing the portion of the computer-generated, each of the plurality of subsets of points including points at:

(a) a plurality of mode distances from the position of interest; and (b) a plurality of mode hardnesses of points at a particular distance.

52. The system of claim 51, wherein separate delay lines relating to each of the plurality of subsets of points are used in developing the reverberation characteristics for the position of interest.

53. The system of claim 50, wherein the environmental parameters further include a total number of points within the subset.

54. The system of claim 53, wherein the machine instructions stored in the memory further cause the processor to derive, in proportion to the total number of points within the subset to the total number of points, a portion of the property set values that includes at least one of:

(a) a reverb decay time; and (b) a reverb volume.

55. The system of claim 48, wherein the machine instructions stored in the memory further cause the processor to derive, in proportion to the mean hardness of the points, a portion of the property set values that include at least one of:

(a) a decay high frequency ratio;

(b) a room high frequency attenuation; and (c) a reflections delay time.

56. The system of claim 48, wherein the machine instructions stored in the memory further cause the processor to derive, in proportion to distances to the points from the position of interest, a portion of the property set values that includes at least one of:

(a) a decay time;

(b) a reflection intensity;

(c) a reflection delay time; and (d) a reverb intensity.

57. The system of claim 48, wherein the graphics data includes a cubemap for the visually displayable contents of the computer-generated environment viewable from the position of interest, and wherein the reverberation characteristics for the position of interest are based on points representable on a plurality of faces of the cubemap.

58. The system of claim 57, wherein the machine instructions stored in the memory further cause the processor to weight the reverberation characteristics derived from each of the plurality of faces according to at least one of:

(a) a face of the cubemap with which the point is associated; and (b) a position within the face of the cubemap with which the point is associated.

59. The system of claim 48, wherein the machine instructions stored in the memory further cause the processor to derive the hardness value from a feature with which the point is associated.

60. The system of claim 48, wherein the machine instructions stored in the memory further cause the processor to retrieve the hardness value from a table listing hardness values associated with materials comprising features potentially included in the computer-generated environment.

61. The system of claim 48, wherein the machine instructions stored in the memory further cause the processor to derive a plurality of reverberation characteristics for the position of interest from the graphics data corresponding to a plurality of aspects of the position of interest and applying each of the plurality of reverberation characteristics to audio channels presented upon execution of the computer-generated environment corresponding to the aspects of the position of interest.

62. The system of claim 61, wherein the machine instructions stored in the memory further cause the processor to determine the plurality of reverberation characteristics for the position of interest by identifying a plurality of secondary positions of interest corresponding to the aspects of the position of interest and determining the reverberation characteristics for each of the secondary positions of interest.

63. The system of claim 61, wherein the aspects of the position of interest correspond to at least one of:

(a) lateral sides of the position of interest; and (b) forward and rearward faces of the position of interest.

64. The system of claim 48, wherein the machine instructions stored in the memory further cause the processor to derive the reverberation characteristics in a pre-processing step performed before the computer-generated environment is visually rendered.

65. The system of claim 64, wherein the machine instructions stored in the memory further cause the processor to store distances from the position of interest to each of the plurality of points in a depth buffer, and to store the hardness of each of the plurality of points in a stencil buffer.

66. The system of claim 64, wherein the machine instructions stored in the memory further cause the processor to store the reverberation characteristics with the position of interest such that the reverberation characteristics are retrievable when the computer-generated environment is visually rendered upon execution.

67. The system of claim 64, wherein the machine instructions stored in the memory further cause the processor to calculate a series of reverberation characteristics for a plurality of positions of interest within the computer-generated environment, the plurality of positions including at least one of:

(a) a plurality of positions selected by an operator; and (b) a plurality of positions at predetermined intervals along an exemplary path through the computer-generated environment.

68. The system of claim 67, wherein the machine instructions stored in the memory further cause the processor to derive reverberation characteristics for an additional position for which the reverberation characteristics were not previously calculated by interpolating the reverberation characteristics for at least two other positions of interest that are proximate to the additional position.

69. The system of claim 48, wherein the machine instructions stored in the memory further cause the processor to enable an operator to selectively adjust at least one of:

(a) allowable ranges of the property set values; and (b) operands used in deriving the property set values from the reverberation characteristics.

70. The system of claim 48, wherein the machine instructions stored in the memory further cause the processor to adjust reverberation for the position of interest by using reverberation characteristics for an alternate position of interest that is one of:

(a) ahead of the position of interest in the computer-generated environment; and (b) behind the position of interest in the computer-generated environment.

* * * * *